(12) United States Patent
Lee et al.

(10) Patent No.: US 12,482,673 B2
(45) Date of Patent: Nov. 25, 2025

(54) LIQUID SUPPLY UNIT, SUBSTRATE TREATING APPARATUS, AND BOTTLE REPLACING METHOD

(71) Applicant: SEMES CO., LTD., Cheonan-si (KR)

(72) Inventors: Dae Woon Lee, Cheonan-si (KR); Young Ju Jo, Hwaseong-si (KR); Sung-Gyu Lee, Cheonan-si (KR)

(73) Assignee: Semes Co., Ltd., Cheonan-si (KR)

( * ) Notice: Subject to any disclaimer, the term of this patent is extended or adjusted under 35 U.S.C. 154(b) by 528 days.

(21) Appl. No.: 17/969,171

(22) Filed: Oct. 19, 2022

(65) Prior Publication Data

US 2023/0131562 A1   Apr. 27, 2023

(30) Foreign Application Priority Data

Oct. 25, 2021   (KR) .................. 10-2021-0142876

(51) Int. Cl.
*H01L 21/67* (2006.01)
*H01L 21/687* (2006.01)

(52) U.S. Cl.
CPC .. *H01L 21/67023* (2013.01); *H01L 21/68764* (2013.01); *H01L 21/68792* (2013.01)

(58) Field of Classification Search
CPC ........ B67D 3/0032; B67D 2210/00097; B67D 3/0029; B67D 1/0892; B65G 65/23
See application file for complete search history.

(56) References Cited

U.S. PATENT DOCUMENTS

| | | | |
|---|---|---|---|
| 2009/0277535 A1* | 11/2009 | Wang .................. | B67D 3/0032 222/164 |
| 2010/0243103 A1* | 9/2010 | Ono ...................... | B65B 3/003 141/129 |
| 2014/0083557 A1 | 3/2014 | George et al. | |
| 2016/0130127 A1* | 5/2016 | Copenhaver ......... | B67D 1/0037 222/129.3 |

FOREIGN PATENT DOCUMENTS

| | | |
|---|---|---|
| CN | 103645606 A | 3/2014 |
| JP | H09-166878 A | 6/1997 |
| JP | 2013-247276 A | 12/2013 |
| KR | 10-2018-0031880 A | 3/2018 |
| KR | 10-2236133 | 4/2021 |

* cited by examiner

*Primary Examiner* — Timothy P. Kelly
(74) *Attorney, Agent, or Firm* — Harness, Dickey & Pierce, P.L.C.

(57) ABSTRACT

Provided is an apparatus for treating a substrate, the apparatus including: a liquid treating chamber for liquid-treating a substrate by supplying a treatment liquid to the substrate; and a liquid supply unit for supplying the treatment liquid to the liquid treating chamber, in which the liquid supply unit includes: a cabinet configured to be mounted with a bottle containing the treatment liquid; and a rotation generating part configured to rotate the bottle so that a direction in which an inlet of the bottle mounted on the cabinet faces is changed.

15 Claims, 17 Drawing Sheets

LIQUID SUPPLY UNIT, SUBSTRATE TREATING APPARATUS, AND BOTTLE REPLACING METHOD

CROSS-REFERENCE TO RELATED APPLICATIONS

This application claims priority to and the benefit of Korean Patent Application No. 10-2021-0142876 filed in the Korean Intellectual Property Office on Oct. 25, 2021, the entire contents of which are incorporated herein by reference.

TECHNICAL FIELD

The present invention relates to a liquid supply unit, and a substrate treating apparatus including the same, and more particularly, to a liquid supply unit which supplies a treatment liquid to a liquid treating chamber which supplies a treatment liquid to a substrate and treats the substrate.

BACKGROUND ART

In order to manufacture a semiconductor device or a flat display panel, various processes, such as a photolithography process, an etching process, an ashing process, a thin film deposition process, a cleaning process, are performed. Among these processes, the photolithography process includes a coating process of supplying a photoresist on a substrate, such as a wafer, to form a coating film, an exposure process of emitting light to the coating film formed on the substrate by using a mask, and a developing process of supplying a developer to the coating film on which the exposure process has been performed to obtain a desired pattern on the substrate.

Typically, the photoresist is stored in a cabinet that supplies the resist. The cabinet is installed in an apparatus for treating substrates. The photoresist is contained in a bottle. The bottle is provided interchangeably in the cabinet. The bottle is connected to a chemical liquid line directly/indirectly connected to a liquid treating chamber performing a coating process. The bottle is also connected to a gas line supplying inert gas into the bottle. A gas line supplies inert gas into the bottle, and pushes the photoresist in the bottle into the chemical liquid line. When the photoresist contained in the bottle is exhausted, the bottle is replaced. Specifically, the user opens the cabinet, separates the empty bottle from the cabinet, and mounts a new bottle in which the photoresist is contained on the cabinet. In addition, an inlet of the bottle mounted on the cabinet always faces upward.

A so-called gas pressurization method in which the photoresist is supplied to the liquid treating chamber by supplying inert gas may generate bubbles in the photoresist contained in the bottle. In addition, since the inlet of the bottle always faces upward, it may be difficult to consume all of the photoresist contained in the bottle.

SUMMARY OF THE INVENTION

The present invention has been made in an effort to provide a liquid supply unit capable of efficiently treating a substrate, and a substrate treating apparatus including the same.

The present invention has also been made in an effort to provide a liquid supply unit capable of minimizing the generation of bubbles and/or particles in a treatment liquid, and a substrate treating apparatus including the same.

The present invention has also been made in an effort to provide a liquid supply unit capable of transferring a treatment liquid in a bottle to a liquid treating chamber without supplying inert gas, and a substrate treating apparatus including the same.

The present invention has also been made in an effort to provide a liquid supply unit capable of effectively consuming a treatment liquid in a bottle, and a substrate treating apparatus including the same.

The problem to be solved by the present invention is not limited to the above-mentioned problems, and the problems not mentioned will be clearly understood by those skilled in the art from the present specification and the accompanying drawings.

An exemplary embodiment of the present invention provides an apparatus for treating a substrate, the apparatus including: a liquid treating chamber for liquid-treating a substrate by supplying a treatment liquid to the substrate; and a liquid supply unit for supplying the treatment liquid to the liquid treating chamber, in which the liquid supply unit includes: a cabinet configured to be mounted with a bottle containing the treatment liquid; and a rotation generating part configured to rotate the bottle so that a direction in which an inlet of the bottle mounted on the cabinet faces is changed.

According to the exemplary embodiment, the liquid supply unit may further include a frame having an internal space, the cabinet may be configured to be insertable into the internal space, and the rotation generating part may rotate the bottle so that the inlet of the bottle faces in a lower direction when the bottle mounted on the cabinet is located in a first position provided in the internal space.

According to the exemplary embodiment, the rotation generating part may rotate the bottle so that the inlet of the bottle faces in an upper direction when the bottle mounted on the cabinet is located in a second position that is out of the internal space.

According to the exemplary embodiment, the rotation generating part may be configured to generate a rotational motion for rotating the bottle from a linear motion of the cabinet moving between the first position and the second position.

According to the exemplary embodiment, the liquid supply unit may include: a first shaft receiving rotational force generated by the rotation generating part; and a second shaft to which the bottle is mounted and which is rotated while being in dependent on the rotation of the first shaft, and the first shaft and the second shaft may be installed in the cabinet.

According to the exemplary embodiment, a rotation axis of the first shaft and a rotation axis of the second shaft may intersect with each other, and the liquid supply unit may include a cross shaft connection part that transmits motion between the first shaft and the second shaft which are cross shafts.

According to the exemplary embodiment, the cross shaft connection part may include: a driving gear installed at one end of the first shaft; and a driven gear installed at one end of the second shaft.

According to the exemplary embodiment, the liquid supply unit may include: a cap which is installed on the second shaft and on which the bottle is mounted; and a chemical liquid line which is connected to the cap and moves the treatment liquid in the bottle mounted on the cap to the liquid treating chamber.

According to the exemplary embodiment, the liquid supply unit may further include: a gas line connected to the cap and supplying gas pressurizing the space in the bottle; and a gas valve installed in the gas line.

According to the exemplary embodiment, the apparatus may further include a controller, in which the controller may control opening and closing of the gas valve so that the gas line selectively supplies gas to the space within the bottle according to a user's setting.

According to the exemplary embodiment, the apparatus may further include a trap unit that removes impurities in the treatment liquid discharged through the chemical liquid line from the bottle mounted on the cabinet and delivered to the liquid treating chamber or air bubbles or impurities in the treatment liquid.

According to the exemplary embodiment, the trap unit may be positioned below the bottle when the inlet of the bottle mounted on the cabinet faces in a lower direction.

Another exemplary embodiment of the present invention provides a liquid supply unit for supplying a treatment liquid to a liquid treating chamber, the liquid supply unit including: a cabinet to which the bottle is replaceably mounted; and a rotation generating part for rotating the bottle so that a posture of the bottle is changed from a supply posture in which an inlet of the bottle faces in a lower direction and a treatment liquid in the bottle is supplied to the liquid treating chamber and a replacement posture in which the inlet of the bottle faces in an upper direction.

According to the exemplary embodiment, the cabinet may be configured to be movable between a first position and a second position different from the first position, and the rotation generating part may rotate the bottle according to the position of the cabinet.

According to the exemplary embodiment, the liquid supply unit may further include a frame having an internal space, the first position may be a position where the bottle is provided in the internal space, and the second position is a position where the bottle is out of the internal space, and the rotation generating part may be configured such that the bottle is in the supply posture when the cabinet is located in the first position, and the bottle is in the replacement posture when the cabinet is located in the second position.

According to the exemplary embodiment, the rotation generating part may be configured to generate a rotational motion for changing the posture of the bottle from a linear motion in which the cabinet moves between the first position and the second position.

Still another exemplary embodiment of the present invention provides a method of replacing a bottle supplying a treatment liquid to a liquid treating chamber, the method including: separating a first bottle from a liquid supply unit supplying the treatment liquid to the liquid treating chamber; mounting a second bottle different from the first bottle on the liquid supply unit; and supplying the treatment liquid in the second bottle to the liquid treating chamber in a state where an inlet of the second bottle faces in a lower direction.

According to the exemplary embodiment, the method may further include rotating the second bottle so that the inlet of the second bottle mounted on the liquid supply unit faces in the lower direction.

According to the exemplary embodiment, the rotating of the second bottle may include rotating the second bottle by converting a linear motion of a cabinet which is included in the liquid supply unit and on which the second bottle is mounted into a rotational motion rotating the second bottle.

According to the exemplary embodiment, the rotating of the second bottle may include rotating the second bottle so that the inlet of the second bottle faces in the lower direction when the second bottle mounted on the cabinet is inserted into an internal space of a frame of the liquid supply unit.

According to the exemplary embodiment of the present invention, it is possible to efficiently treat a substrate.

In addition, according to the exemplary embodiment of the present invention, it is possible to minimize the generation of bubbles and/or particles in the treatment liquid.

In addition, according to the exemplary embodiment of the present invention, the treatment liquid in the bottle may be delivered to the liquid treating chamber without supplying inert gas.

In addition, according to the exemplary embodiment of the present invention, it is possible to effectively consume the treatment liquid in the bottle.

The effect of the present invention is not limited to the foregoing effects, and non-mentioned effects will be clearly understood by those skilled in the art from the present specification and the accompanying drawings.

DETAILED DESCRIPTION

Figure 1:
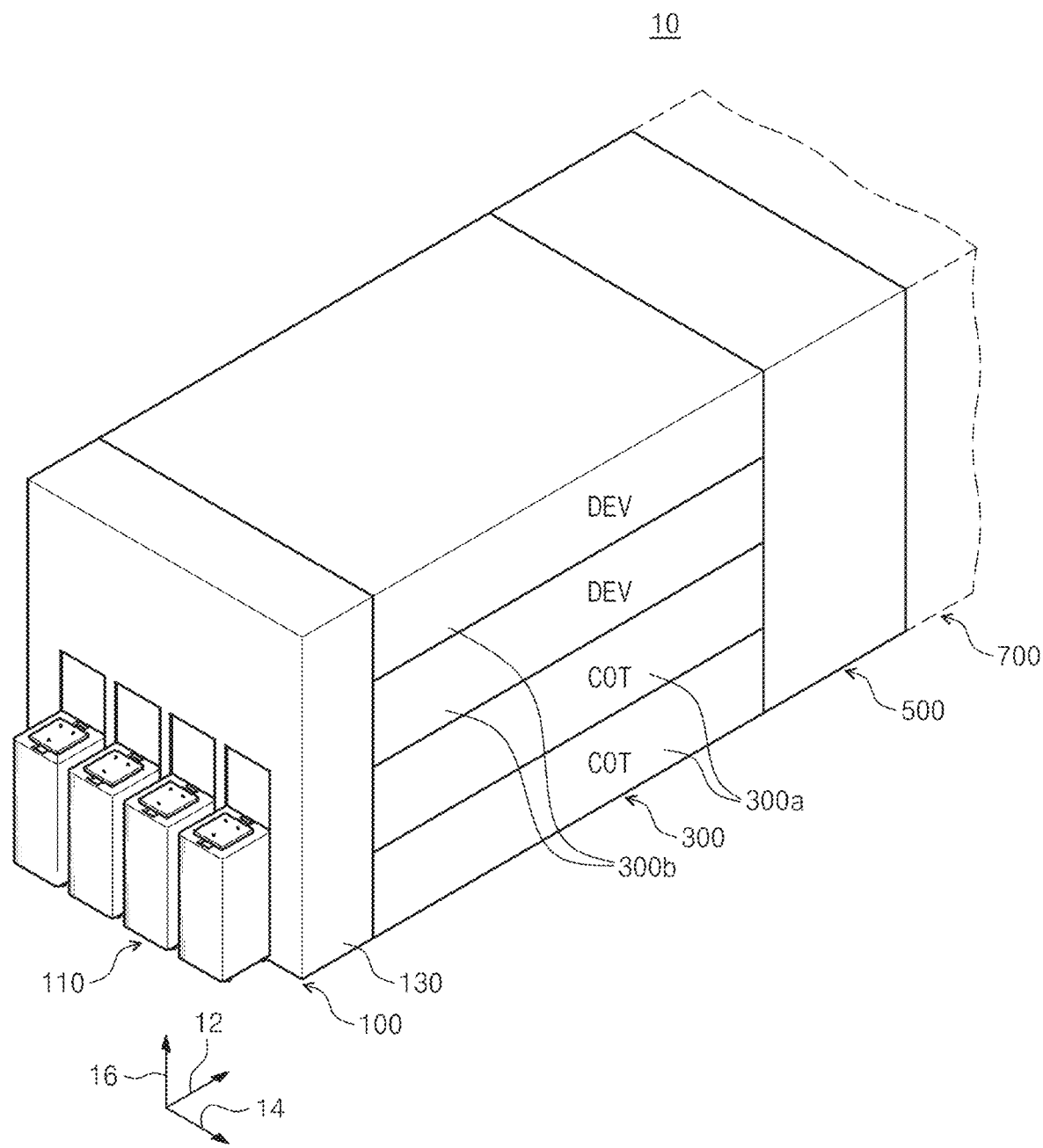
FIG. 1 is a perspective view schematically illustrating a substrate treating apparatus according to an exemplary embodiment of the present invention.

Hereinafter, an exemplary embodiment of the present invention will be described more fully hereinafter with reference to the accompanying drawings, in which exemplary embodiments of the invention are illustrated. However, the present invention can be variously implemented and is not limited to the following exemplary embodiments. In addition, in describing an exemplary embodiment of the present invention in detail, if it is determined that a detailed description of a related well-known function or configuration may unnecessarily obscure the gist of the present invention, the detailed description thereof will be omitted. In addition, the same reference numerals are used throughout the drawings for parts having similar functions and actions.

Unless explicitly described to the contrary, the word "comprise" and variations such as "comprises" or "comprising" will be understood to imply the inclusion of stated elements but not the exclusion of any other elements. It will be appreciated that terms "including" and "having" are intended to designate the existence of characteristics, numbers, operations, operations, constituent elements, and components described in the specification or a combination thereof, and do not exclude a possibility of the existence or addition of one or more other characteristics, numbers, operations, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

It should be understood that when one constituent element referred to as being "coupled to" or "connected to" another constituent element, one constituent element can be directly coupled to or connected to the other constituent element, but intervening elements may also be present. In contrast, when one constituent element is "directly coupled to" or "directly connected to" another constituent element, it should be understood that there are no intervening element present. Other expressions describing the relationship between the constituent elements, such as "between ~" and "just between ~" or "adjacent to ~" and "directly adjacent to ~" should be interpreted similarly.

All terms used herein including technical or scientific terms have the same meanings as meanings which are generally understood by those skilled in the art unless they are differently defined. Terms defined in generally used dictionary shall be construed that they have meanings matching those in the context of a related art, and shall not be construed in ideal or excessively formal meanings unless they are clearly defined in the present application.

Hereinafter, an embodiment of the present invention will be described with reference to FIGS. 1 to 17. In addition, all configurations for transferring a substrate W described below may be referred to as a transfer unit.

Figure 2:
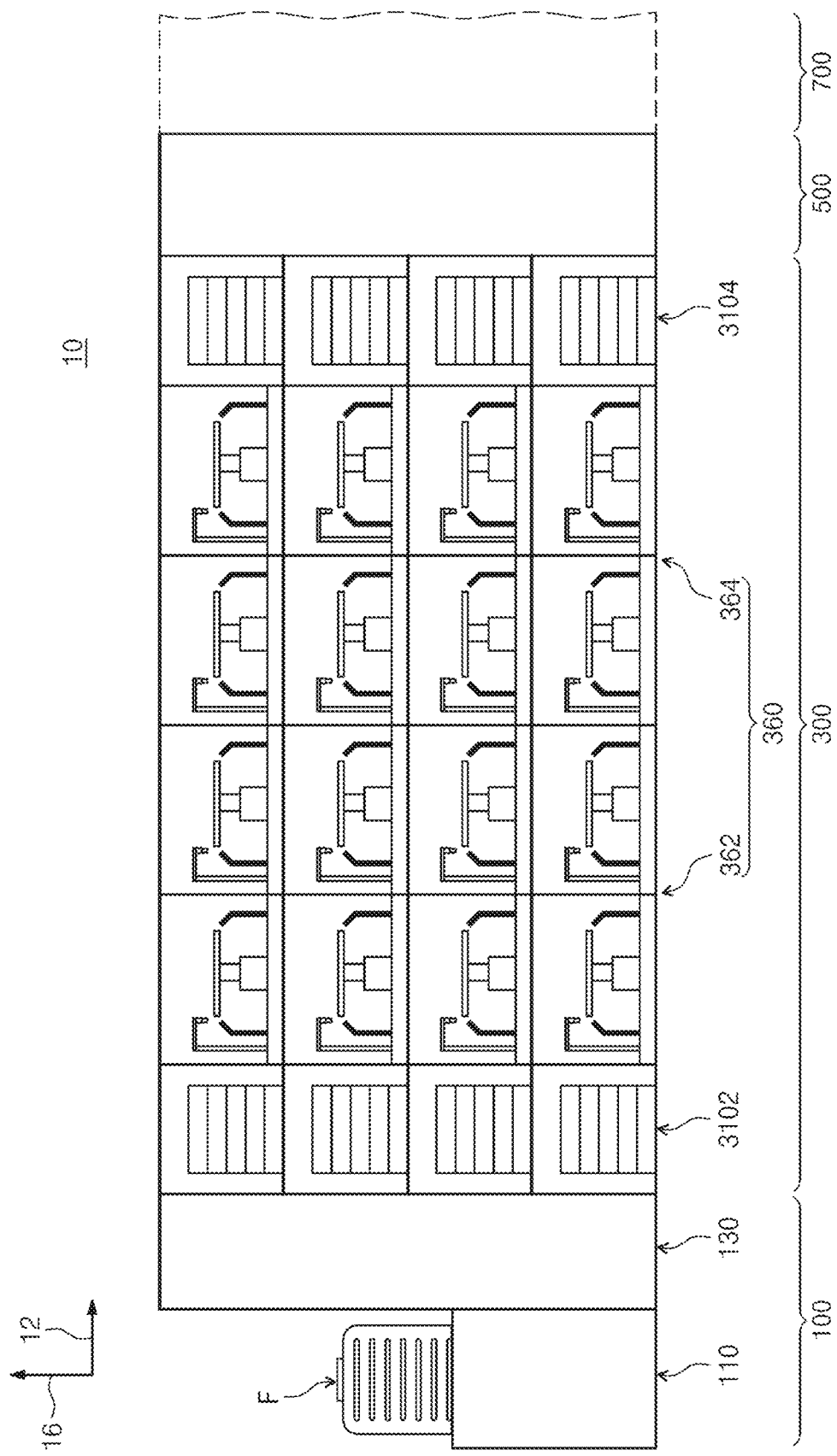
FIG. 2 is a cross-sectional view illustrating a coating block or a developing block of the substrate treating apparatus of FIG. 1.
Figure 3:
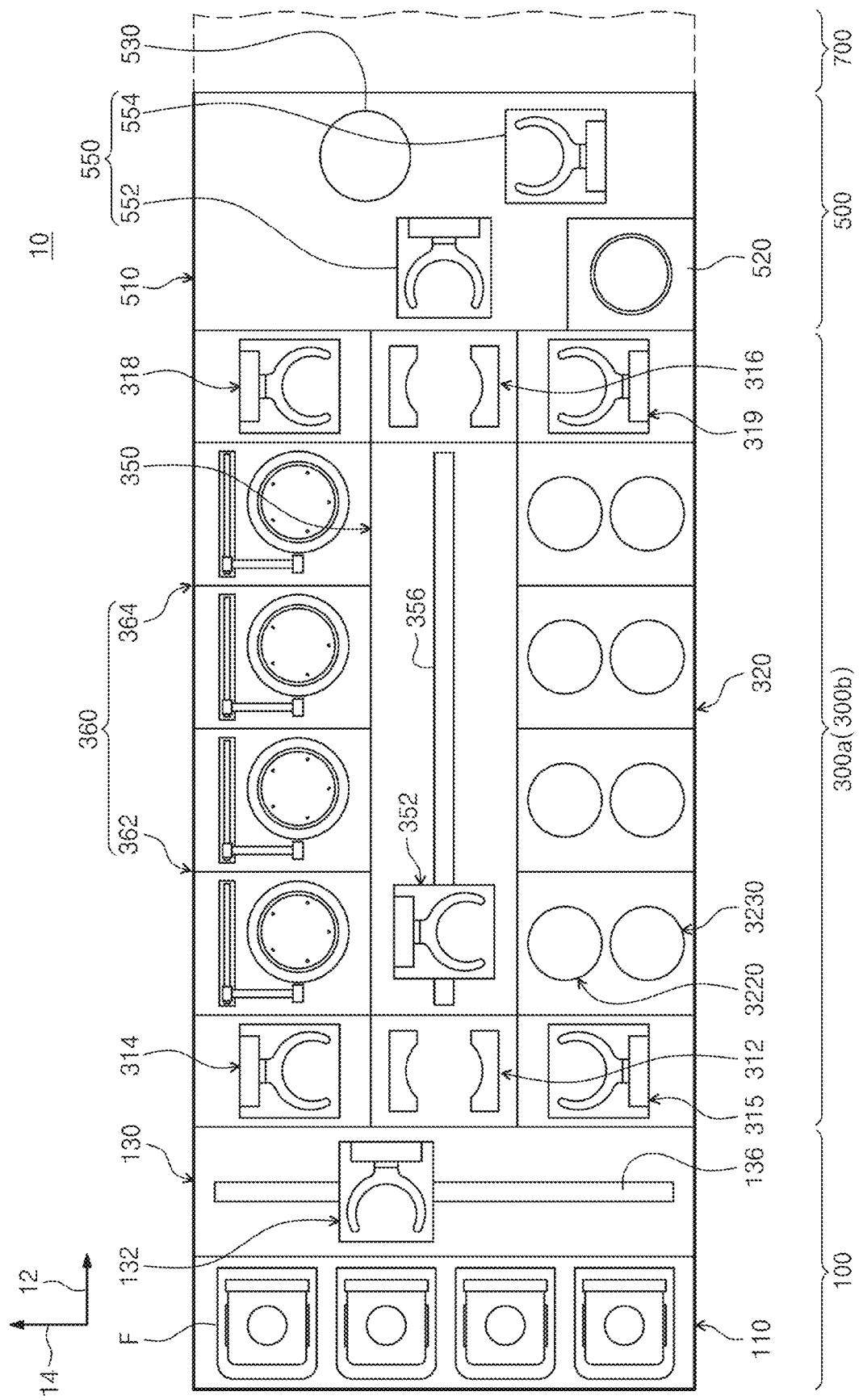
FIG. 3 is a top plan view of the substrate treating apparatus of FIG. 1.

FIG. 1 is a perspective view schematically illustrating a substrate treating apparatus according to an exemplary embodiment of the present invention, FIG. 2 is a cross-sectional view of a coating block or a developing block of the substrate treating apparatus illustrating of FIG. 1, and FIG. 3 is a top plan view of the substrate treating apparatus of FIG. 1.

Referring to FIGS. 1 to 3, a substrate treating apparatus 10 according to the exemplary embodiment of the present invention includes an index module 100, a treating module 300, an interface module 500, and a controller 600. According to the exemplary embodiment, the index module 100, the treating module 300, and the interface module 500 are sequentially arranged in a line. Hereinafter, the direction in which the index module 100, the treating module 300, and the interface module 500 are arranged is called a first direction 12, and when viewed from the top, a direction perpendicular to the first direction 12 is defined as a second direction 14, and a direction perpendicular to both the first direction 12 and the second direction 14 is defined as a third direction 16.

The controller may control the substrate treating apparatus 10. For example, the controller may control the index module 100, the treating module 300, and the interface module 500 included in the substrate treating apparatus 10.

Also, the controller may control a liquid supply device 2000 to be described later.

The controller may include a process controller formed of a microprocessor (computer) that executes the control of the substrate treating apparatus 10, a user interface formed of a keyboard in which an operator performs a command input operation or the like in order to manage the substrate treating apparatus 10, a display for visualizing and displaying an operation situation of the substrate treating apparatus 10, and the like, and a storage unit storing a control program for executing the process executed in the substrate treating apparatus 10 under the control of the process controller or a program, that is, a processing recipe, for executing the process in each component according to various data and processing conditions. Further, the user interface and the storage unit may be connected to the process controller. The processing recipe may be stored in a storage medium in the storage unit, and the storage medium may be a hard disk, and may also be a portable disk, such as a CD-ROM or a DVD, or a semiconductor memory, such as a flash memory.

The index module 100 transfers a substrate W to the treating module 300 from a container F in which the substrate W is accommodated, and receives the completely treated substrate W into the container F. A longitudinal direction of the index module 100 is provided in the second direction 14. The index module 100 includes a load port 110 and an index frame 130. With respect to the index frame 130, the load port 110 is located on the opposite side of the treating module 300. The container F in which the substrates W are accommodated is placed on the load port 110. A plurality of load ports 110 may be provided, and the plurality of load ports 110 may be disposed along the second direction 14.

As the container F, an airtight container F, such as a Front Open Unified Pod (FOUP), may be used. The container F may be placed on the load port 110 by a transfer means (not illustrated), such as an overhead transfer, an overhead conveyor, or an automatic guided vehicle, or an operator.

An index robot 132 is provided inside the index frame 130. A guide rail 136 of which a longitudinal direction is provided in the second direction 14 is provided within the index frame 130, and the index robot 132 may be provided to be movable on the guide rail 136. The index robot 132 includes a hand on which the substrate W is placed, and the hand is provided to be movable forward and backward, rotatable about the third direction 16, and movable in the third direction 16.

The treating module 300 may perform a coating process and a developing process on the substrate W. The treating module 300 may receive the substrate W accommodated in the container F and perform a substrate treating process. The treating module 300 includes a coating block 300a and a developing block 300b. The coting block 300a performs a coating process on the substrate W, and the developing block 300b performs a developing process on the substrate W. A plurality of coating blocks 300a is provided, and the coating blocks 300a are provided to be stacked on each other. A plurality of developing blocks 300b is provided, and the developing blocks 300b is provided to be stacked on each other. According to the exemplary embodiment of FIG. 1, two applying blocks 300a are provided, and two developing blocks 300b are provided. The coating blocks 300a may be disposed under the developing blocks 300b. According to an example, the two coating blocks 300a perform the same process, and may be provided in the same structure. Further, the two developing blocks 300b may perform the same process and may be provided in the same structure.

Referring to FIG. 3, each of the applying block 300a and the developing block 300b has a heat treating chamber 320, a transfer chamber 350, a liquid treating chamber 360, and buffer chambers 312 and 316.

The heat treating chamber 320 performs a heating process on the substrate W. A plurality of heat treating chambers 320 is provided. The heat treating chambers 320 are arranged in the first direction 12. The heat treating chambers 320 are located at one side of the transfer chamber 350.

The liquid treating chamber 360 may supply a coating liquid, such as a photoresist, onto the substrate W to form a coating film or supply a developer for extracting a pattern from the liquid film on which an exposure process has been performed. The coating film may be a photoresist layer or an Anti-Reflective Applying layer (ARC).

The transfer chamber 350 transfers the substrate W between the heat treating chamber 320 and the liquid treating chamber 360 in the coating block 300a or the developing block 300b. The transfer chamber 350 is provided so that a longitudinal direction thereof is parallel to the first direction 12. The transfer robot 350 is provided to the transfer chamber 352. The transfer robot 352 transfers the substrate between the heat treating chamber 320, the liquid treating chamber 360, and the buffer chambers 312 and 316. According to an example, the transfer robot 352 includes a hand on which the substrate W is placed, and the hand may be provided to be movable forward and backward, rotatable about the third direction 16, and movable in the third direction 16. A guide rail 356, of which a longitudinal direction is parallel to the first direction 12, is provided within the transfer chamber 350, and the transfer robot 900 may be provided to be movable on the guide rail 356.

A plurality of buffer chambers 312 and 316 is provided. Some of the buffer chambers 312 and 316 are disposed between the index module 100 and the transfer chamber 350. Hereinafter, the foregoing buffer chambers are referred to as front buffers 312. A plurality of front buffers 312 are provided, and are positioned to be stacked on each other in the vertical direction. Another part of the buffer chambers 312 and 316 is disposed between the transfer chamber 350 and the interface module 500. Hereinafter, the foregoing buffer chambers are referred to as rear buffers 316. A plurality of rear buffers 316 are provided, and are positioned to be stacked on each other in the vertical direction. Each of the front buffers 312 and the rear buffers 316 temporarily stores a plurality of substrates W. The substrate W stored in the front buffer 312 is loaded or unloaded by the index robot 132 and the transfer robot 352. The substrate W stored in the rear buffer 316 is loaded or unloaded by the transfer robot 352 and the first robot 552.

In addition, a first front buffer robot 314 and a second front buffer robot 315 for transferring the substrate W between the front buffers 312 may be provided on one side and the other side of the front buffer 312. The first front buffer robot 314 and the second front buffer robot 315 may be positioned symmetrically to each other with the front buffer 312 interposed therebetween when viewed from the top. In addition, the first front buffer robot 314 and the second front buffer robot 315 may each have a transfer hand. In addition, the first front buffer robot 314 and the second front buffer robot 315 may be provided at different heights from each other.

In addition, a first rear buffer robot 318 and a second rear buffer robot 319 for transferring the substrate W between the rear buffers 316 may be provided on one side and the other side of the rear buffer 316. The first rear buffer robot 318 and the second rear buffer robot 319 may be positioned symmetrically to each other with the rear buffer 316 interposed therebetween when viewed from the top. In addition, the first rear buffer robot 318 and the second rear buffer robot 319 may each have a transfer hand. In addition, the first rear buffer robot 318 and the second rear buffer robot 319 may be provided at different heights from each other.

The interface module 500 connects the treating module 300 to an external exposing device 700. The interface module 500 includes an interface frame 510, an additional process chamber 520, an interface buffer 530, and an interface robot 550.

A fan filter unit for forming a descending airflow therein may be provided at an upper end of the interface frame 510. The additional process chamber 520, the interface buffer 530, and the interface robot 550 are disposed inside the interface frame 510. In the additional process chamber 520, the substrate W that has been completely processed in the coating block 300a may be transferred to the exposing device 700. In the exposing device 700, an exposure process of irradiating light by using a mask may be performed on the substrate W on which the coating film is formed. In addition, a predetermined additional process may be performed before the substrate W is loaded into the exposing device 700. Optionally, the additional process chamber 520 may perform a predetermined additional process before the substrate W, which has been completely processed in the exposing device 700, is loaded into the developing block 300b. According to one example, the additional process may be an edge exposure process of exposing an edge region of the substrate W, a top surface cleaning process of cleaning the upper surface of the substrate W, or a lower surface cleaning process of cleaning the lower surface of the substrate W. A plurality of additional process chambers 520 is provided, and may be provided to be stacked on each other. All of the additional process chambers 520 may be provided to perform the same process. Optionally, a part of the additional process chambers 520 may be provided to perform different processes.

The interface buffer 530 provides a space in which the substrate W transferred between the coating block 300*a*, the additional process chamber 520, the exposing device 700, and the developing block 300*b* temporarily stays during the transfer. A plurality of interface buffers 530 may be provided, and the plurality of interface buffers 530 may be provided to be stacked on each other.

According to the example, the additional process chamber 520 may be disposed on one side of the transfer chamber 350 based on an extended line in the longitudinal direction and the interface buffer 530 may be disposed on the other side thereof.

The interface robot 550 transfers the substrate W between the coating block 300*a*, the additional process chamber 520, the exposing device 700, and the developing block 300*b*. The interface robot 550 may have a transfer hand that transfers the substrate W. The interface robot 550 may be provided as one or a plurality of robots. According to the example, the interface robot 550 has a first robot 552 and a second robot 554. The first robot 552 may be provided to transfer the substrate W between the coating block 300*a*, the additional process chamber 520, and the interface buffer 530, and the second robot 554 may be provided to transfer the substrate W between the interface buffer 530 and the exposing device 700, and the second robot 554 may be provided to transfer the substrate W between the interface buffer 530 and the developing block 300*b*.

The first robot 552 and the second robot 554 each include a transfer hand on which the substrate W is placed, and the hand may be provided to be movable forward and backward, rotatable about an axis parallel to the third direction 16, and movable along the third direction 16.

Figure 4:
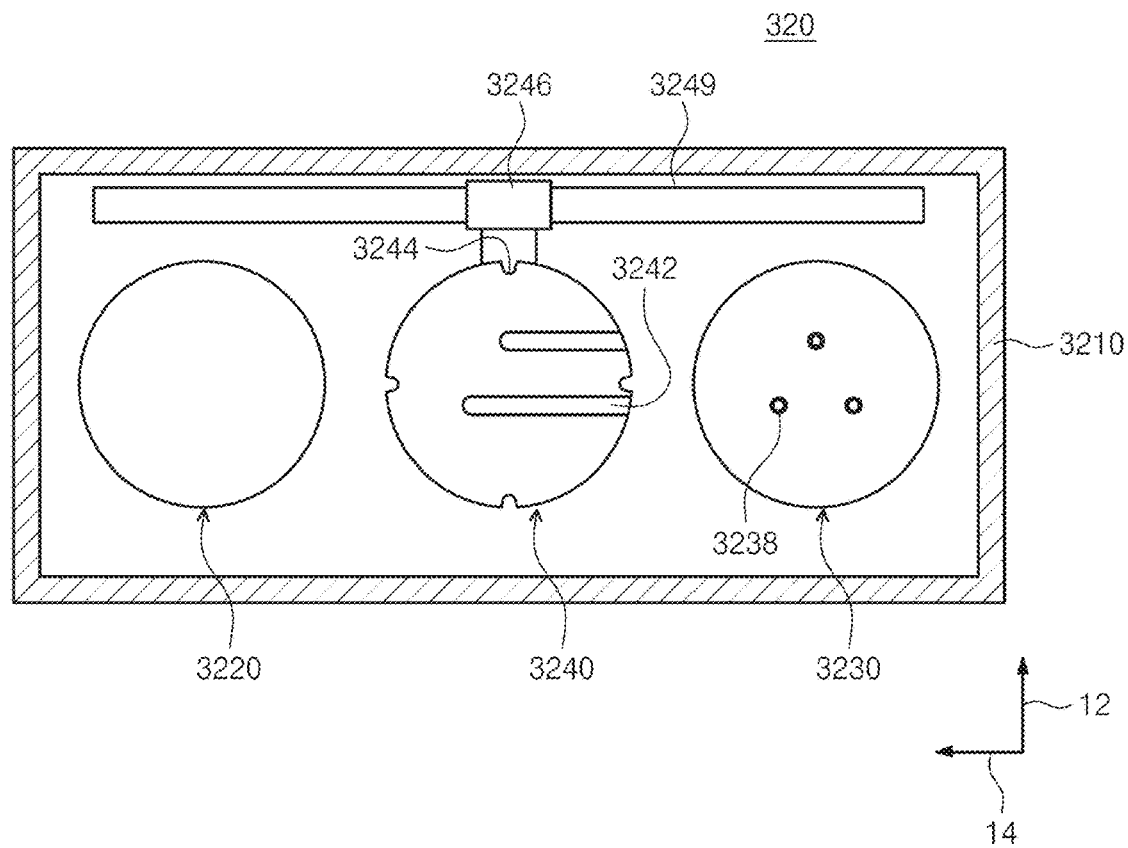
FIG. 4 is a plan view schematically illustrating an example of a heat treating chamber of FIG. 3.
Figure 5:
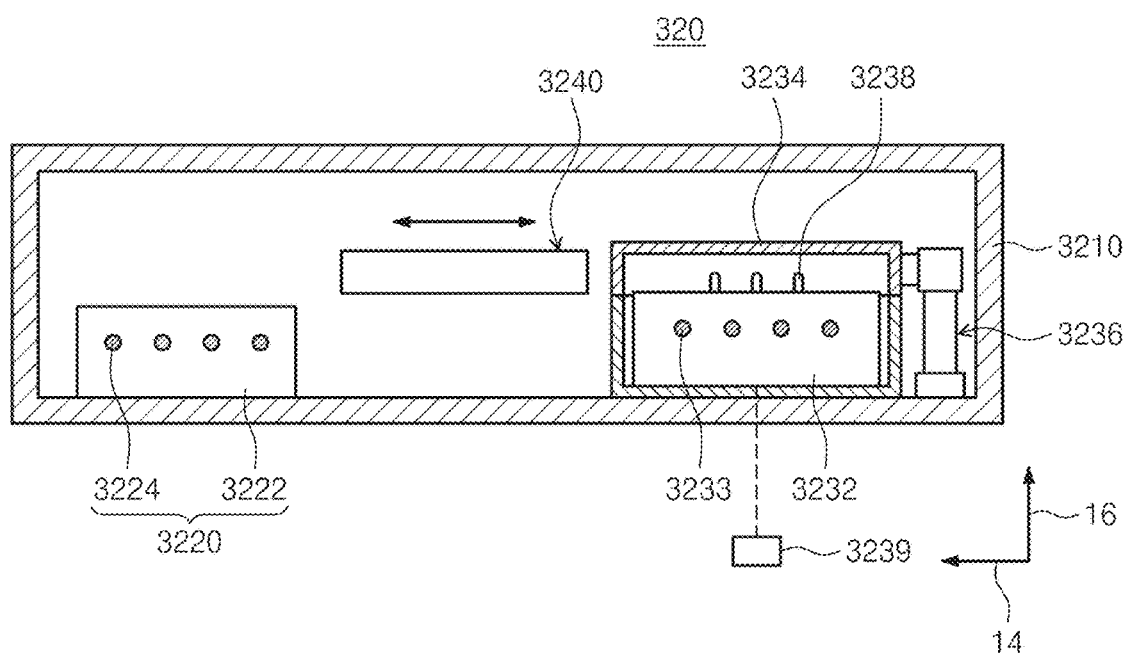
FIG. 5 is a front view of the heat treating chamber of FIG. 4.

FIG. 4 is a plan view schematically illustrating an example of the heat treating chamber of FIG. 3, and FIG. 5 is a front view of the heat treating chamber of FIG. 4.

Referring to FIGS. 4 and 5, the heat treating chamber 320 includes a housing 3210, a cooling unit 3220, a heating unit 3230, and a transfer plate 3240.

The housing 3210 is provided in the shape of a generally rectangular parallelepiped. An entrance (not illustrated) through which the substrate W enters and exits is formed on the sidewall of the housing 3210. The entrance may remain open. Optionally, a door (not illustrated) may be provided to open and close the entrance. The cooling unit 3220, the heating unit 3230, and the transfer plate 3240 are provided in the housing 3210. The cooling unit 3220 and the heating unit 3230 are provided side by side along the second direction 14. According to an example, the cooling unit 3220 may be located closer to the transfer chamber 350 than the heating unit 3230.

The cooling unit 3220 includes a cooling plate 3222. The cooling plate 3222 may have a generally circular shape when viewed from the top. The cooling plate 3222 is provided with a cooling member 3224. According to an example, the cooling member 3224 is formed inside the cooling plate 3222 and may be provided as a flow path through which the cooling fluid flows.

The heating unit 3230 includes a heating plate 3232, a cover 3234, a heater 3233, and a temperature sensor 3239. The heating plate 3232 has a generally circular shape when viewed from the top. The heating plate 3232 has a larger diameter than that of the substrate W. A heater 3233 is installed in the heating plate 3232. The heater 3233 may be provided as a heating resistor to which current is applied. The heating plate 3232 is provided with lift pins 3238 drivable in the vertical direction along the third direction 16. The lift pin 3238 receives the substrate W from the transfer means outside the heating unit 3230 and places the received substrate W on the heating plate 3232 or lifts the substrate W from the heating plate 3232 and takes over the substrate W to a transfer means outside the heating unit 3230. According to an example, three lift pins 3238 may be provided. The cover 3234 has a space with an open lower portion therein. The cover 3234 is positioned above the heating plate 3232 and is moved up and down by the driver 3236. A space formed by the cover 3234 and the heating plate 3232 according to the movement of the cover 3234 is provided as a heating space for heating the substrate W. The temperature sensor 3239 may measure the temperature of the heating plate 3232 in real time, and transmit the measured temperature value of the heating plate 3232 to the controller in real time.

The transfer plate 3240 is provided in a substantially disk shape, and has a diameter corresponding to that of the substrate W. A notch 3240 is formed at the edge of the transfer plate 3244. The notch 3244 may have a shape corresponding to a protrusion 3543 formed on the hand 354 of the transfer robot 352. In addition, the notches 3244 are provided in a number corresponding to the number of protrusions 3543 formed on the hand 354, and are formed at positions corresponding to the protrusions 3543. When the upper and lower positions of the hand 354 and the transfer plate 3240 are changed in a position where the hand 354 and the transfer plate 3240 are vertically aligned, the substrate W is transferred between the hand 354 and the transfer plate 3240. The transfer plate 3240 is mounted on a guide rail 3249, and may be moved between a first region 3212 and a second region 3214 along the guide rail 3249 by a driver 3246. A plurality of slit-shaped guide grooves 3242 is provided in the transfer plate 3240. The guide groove 3242 extends from the end of the transfer plate 3240 to the inside of the transfer plate 3240. The length direction of the guide grooves 3242 is provided along the second direction 14, and the guide grooves 3242 are spaced apart from each other along the first direction 12. The guide groove 3242 prevents the transfer plate 3240 and the lift pins 3238 from interfering with each other when the substrate W is transferred between the transfer plate 3240 and the heating unit 3230.

The substrate W is cooled in the state where the transfer plate 3240 on which the substrate W is placed is in contact with the cooling plate 3222. The transfer plate 3240 is made of a material having high thermal conductivity so that heat transfer between the cooling plate 3222 and the substrate W is well achieved. According to an example, the transfer plate 3240 may be provided with a metal material.

The heating units 3230 provided in some of the heat treating chambers 320 may supply a gas while heating the substrate W to improve the adhesion rate of the photoresist to the substrate W. According to the example, the gas may be hexamethyldisilane (HMDS) gas.

A plurality of liquid treating chambers 360 is provided. Some of the liquid treating chambers 360 may be provided to be stacked on each other. The liquid treating chambers 360 are disposed at one side of the transfer chamber 350. The liquid treating chambers 360 are arranged side by side along the first direction 12. Some of the liquid treating chambers 360 are provided at positions adjacent to the index module 100. Hereinafter, the liquid treating chambers 360 are referred to as front liquid treating chambers 362. Another some of the liquid treating chambers 360 are provided at positions adjacent to the interface module 500. Hereinafter, the liquid treating chambers 360 are referred to as rear liquid treating chambers 364. The coating liquid may be supplied from the liquid treating chamber 360 provided in the coating block 300a, and the developer may be supplied from the liquid treating chamber 360 provided in the developing block 300b.

Figure 6:
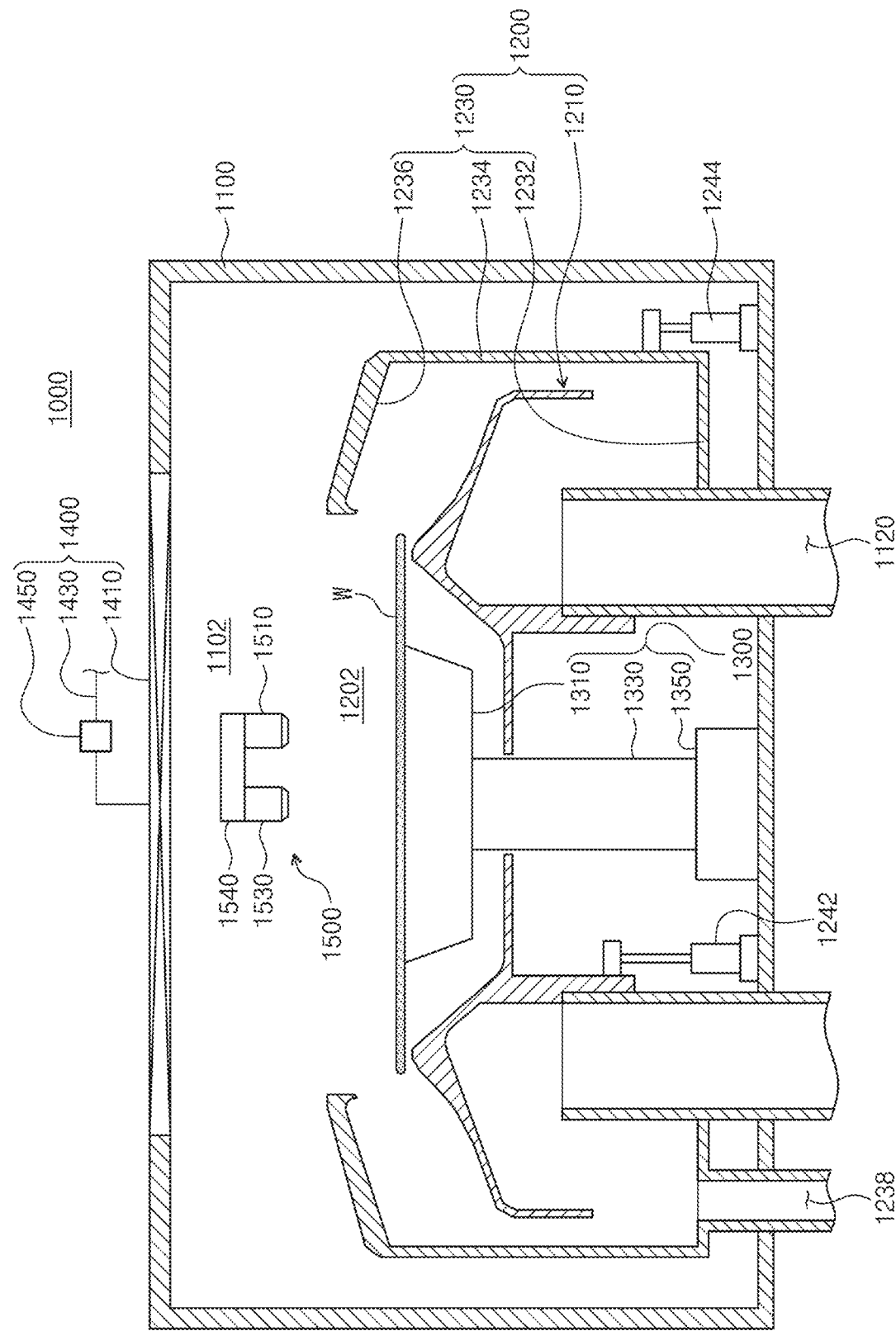
FIG. 6 is a diagram schematically illustrating an example of a substrate treating apparatus provided in the liquid treating chamber of FIG. 7.
Figure 7:
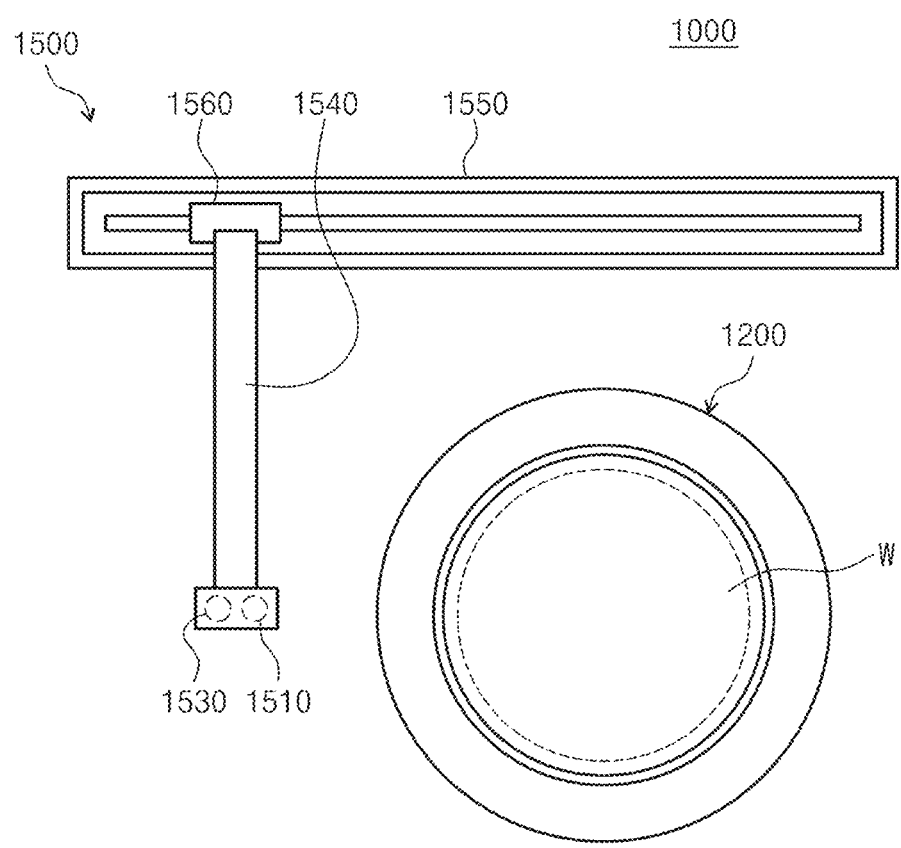
FIG. 7 is a top plan view of the substrate treating apparatus provided in the liquid treating chamber of FIG. 6.

FIG. 6 is a diagram schematically illustrating an example of the substrate treating apparatus provided in the liquid treating chamber of FIG. 7, and FIG. 7 is a top plan view of the substrate treating apparatus provided in the liquid treating chamber of FIG. 6. FIGS. 6 and 7 illustrate the liquid treating chamber 360 provided in the coating block 300a. In addition, since the liquid treating chamber 360 provided in the developing block 300b has the same/similar configuration as the liquid treating chamber 360 provided in the coating block 300a except that the type of treatment liquid used is different, a repeated description of the liquid treating chamber 360 provided in the developing block 300b will be omitted.

Referring to FIGS. 6 and 7, a substrate treating apparatus 1000 for treating a substrate W may be provided in the liquid treating chamber 360. The substrate treating apparatus 1000 performing the liquid treatment on the substrate W may be provided in the liquid treating chamber 360.

The substrate treating apparatus 1000 provided in the liquid treating chamber 360 may include a housing 1100, a treating vessel 1200, a support unit 1300, an airflow supply unit 1400, and a liquid discharge unit 1500.

The housing 1100 may have an internal space 1102. The housing 1100 may be provided in a quadrangular cylindrical shape having the internal space 1102. An opening (not illustrated) may be formed at one side of the housing 1100. The opening may serve as an inlet through which the substrate W is loaded into the internal space 1102 or the substrate W is unloaded from the internal space 1102. In addition, in order to selectively close the opening, a door (not illustrated) may be installed in an area adjacent to the opening. The door may seal the internal space 1102 by blocking the opening while the processing process for the substrate W loaded into the internal space 1102 is performed.

The treating vessel 1200 may be disposed in the internal space 1102. The treating vessel 1200 may have a processing space 1202. That is, the treating vessel 1200 may be a bowl having the processing space 1202. Accordingly, the internal space 1102 may be provided to surround the processing space 1202. The treating vessel 1200 may have a cup shape with an open top. The processing space 1202 of the treating vessel 1200 may be a space in which a support unit 1300, which is to be described below, supports and rotates the substrate W. The processing space 1202 may be a space in which each of the liquid discharge unit 1500 and a wetting unit 1600 supplies a processing medium and the substrate W is treated.

The treating vessel 1200 may include an inner cup 1210 and an outer cup 1230. The outer cup 1230 is provided to surround the circumference of the support unit 1300, and the inner cup 1210 may be located inside the outer cup 1230. Each of the inner cup 1210 and the outer cup 1230 may have an annular ring shape when viewed from the top. A space between the inner cup 1210 and the outer cup 1230 may function as a recovery path through which the treatment medium introduced into the processing space 1202 is recovered.

The inner cup 1230 may be provided in a shape surrounding a rotation shaft 1330 of the support unit 1300, which is to be described below, when viewed from the top. For example, the inner cup 1230 may be provided in a circular plate shape surrounding the rotation shaft 1330 when viewed from above. When viewed from the top, the inner cup 1230 may be positioned to overlap an exhaust port 1120 coupled to the housing 1100. The inner cup 1230 may have an inner portion and an outer portion. An upper surface of each of the inner portion and the outer portion may be provided to have different angles from each other based on a virtual horizontal line. For example, when viewed from the top, the inner portion may be positioned to overlap the support plate 1310 of the support unit 1300, which is to be described below. The inner portion may be positioned to face the rotation shaft 1330. The inner portion may have an upper surface inclined upward as it goes away from the rotation shaft 1330, and the outer portion may extend outwardly from the inner portion. The outer portion may have an upper surface inclined downward as it goes away from the rotation shaft 1330. The upper end of the inner portion may coincide with the side end portion of the substrate W in the vertical direction. According to the example, the point where the outer portion and the inner portion meet may be a position lower than the upper end of the inner portion. The point where the inner portion the outer portion meet each other may be provided to be rounded. The outer portion may be combined with the outer cup 1230 to form a recovery path through which a treatment medium, such as a treatment liquid and a wet medium, is recovered.

The outer cup 1230 may be provided in a cup shape surrounding the support unit 1300 and the inner cup 1210. The outer cup 1230 may have a bottom portion 1232, a side portion 1234, and an inclined portion 1236. The bottom portion 1232 may have a circular plate shape having a hollow. A recovery line 1238 may be connected to the bottom portion 1232. The recovery line 1238 may recover the treatment medium supplied on the substrate W. The processing medium recovered by the recovery line 1238 may be reused by an external recycling system. The side portion 1234 may have an annular ring shape surrounding the support unit 1300. The side portion 1234 may extend in a vertical direction from the side end of the bottom portion 1232. The side portion 1234 may extend upwardly from bottom portion 1232.

The inclined portion 1236 may extend from an upper end of the side portion 1234 in a direction toward the central axis of the outer cup 1230. An inner surface of the inclined portion 1236 may be provided to be inclined upward to approach the support unit 1300. The inclined portion 1236 may be provided to have a ring shape. During the processing process for the substrate W, the upper end of the inclined portion 1236 may be positioned higher than the substrate W supported by the support unit 1300.

The inner lifting member 1242 and the outer lifting member 1244 may move the inner cup 1210 and the outer cup 1230 up and down, respectively. The inner lifting member 1242 is coupled to the inner cup 1210, and the outer lifting member 1244 is coupled to the outer cup 1230 to move the inner cup 1210 and the outer cup 1230 up and down, respectively.

The support unit 1300 may support and rotate the substrate W. The support unit 1300 may be a chuck that supports and rotates the substrate W. The support unit 1300 may include the support plate 1310, the rotation shaft 1330, and a rotation driver 1350. The support plate 1310 may have a seating surface on which the substrate W is seated. The support plate 1310 may have a circular shape when viewed from the top. The support plate 1310 may have a smaller diameter than the substrate W when viewed from the top. A suction hole (not illustrated) is formed in the support plate 1310 to chuck the substrate W by a vacuum suction method. Optionally, an electrostatic plate (not illustrated) is provided on the support plate 1310 to chuck the substrate W by an electrostatic adsorption method using static electricity. Optionally, the support plate 1310 may be provided with support pins for supporting the substrate W so that the support pins and the substrate W are physically in contact with each other to chuck the substrate W.

The rotation shaft 1330 may be coupled to the support plate 1310. The rotation shaft 1330 may be coupled to a lower surface of the support plate 1310. The rotation shaft 1330 may be provided such that a longitudinal direction thereof is in the vertical direction. The rotation shaft 1330 may be rotated by receiving power from the rotation driver 1350. Accordingly, the rotation shaft 1330 may rotate the support plate 1310. The rotation driver 1350 may vary the rotation speed of the rotation shaft 1330. The rotation driver 1350 may be a motor that provides driving force. However, the present invention is not limited thereto, and the rotation driver 1350 may be variously modified to a known device that provides driving force.

The airflow supply unit 1400 may supply an airflow to the internal space 1102. The airflow supply unit 1400 may supply a descending airflow to the internal space 1102. The airflow supply unit 1400 may supply the temperature and/or humidity-controlled airflow to the internal space 1102. The airflow supply unit 1400 may be installed in the housing 1100. The airflow supply unit 1400 may be installed above the treating vessel 1200 and the support unit 1300. The airflow supply unit 1400 may include a fan 1410, an airflow supply line 1430, and a filter 1450. The airflow supply line 1430 may supply an external airflow whose temperature and/or humidity is controlled to the internal space 1102. A filter 1450 is installed in the airflow supply line 1430 to remove impurities contained in the external airflow flowing through the airflow supply line 1430. In addition, when the fan 1410 is driven, the external airflow supplied by the airflow supply line 1430 may be uniformly transmitted to the internal space 1102.

The liquid discharge unit 1500 may discharge the treatment liquid to the substrate W supported by the support unit 1300. The treatment liquid supplied by the liquid discharge unit 1500 to the substrate W may be a coating liquid. For example, the applying liquid may be a photosensitive liquid, such as a photoresist. Also, the liquid discharge unit 1500 may supply the pre-wet liquid to the substrate W supported by the support unit 1300. The pre-wet liquid supplied by the liquid discharge unit 1500 to the substrate W may be a liquid capable of changing the surface properties of the substrate W. For example, the pre-wet liquid may be a thinner capable of changing the surface property of the substrate W to have a hydrophobic property.

The liquid discharge unit 1500 may include a free wet nozzle 1510, a treatment liquid nozzle 1530, an arm 1540, a guide rail 1550, and a driver 1560.

The pre-wet nozzle 1510 may supply the above-described pre-wet liquid to the substrate W. The pre-wet nozzle 1510 may supply the pre-wet liquid to the substrate W in a stream manner. The treatment liquid nozzle 1530 may supply the above-described treatment liquid to the substrate W. The treatment liquid nozzle 1530 may be a coating liquid nozzle that supplies a coating liquid, such as the above-described photoresist. The treatment liquid nozzle 1530 may supply the treatment liquid to the substrate W in a stream manner Both the pre-wet liquid and the coating liquid may be referred to as a treatment liquid.

The arm 1540 may support the free wet nozzle 1510 and the treatment liquid nozzle 1530. The free wet nozzle 1510 and the treatment liquid nozzle 1530 may be installed at one end of the arm 1540. Each of the free wet nozzle 1510 and the treatment liquid nozzle 1530 may be installed on the lower surface of one end of the arm 1540. When viewed from the top, the free wet nozzle 1510 and the treatment liquid nozzle 1530 may be arranged in a direction parallel to the longitudinal direction of the guide rail 1550 which is to be described below. The other end of the arm 1540 may be coupled to the driver 1560. The arm 1540 may be moved by driver 1560 which moves arm 1540. Accordingly, the positions of the free wet nozzle 1510 and the treatment liquid nozzle 1530 installed on the arm 1540 may be changed. The movement direction of the arm 1540 may be guided along the guide rail 1550 on which the driver 1560 is installed. The guide rail 1550 may be provided such that a longitudinal direction thereof faces a horizontal direction. For example, the guide rail 1550 may be provided such that its longitudinal direction faces a direction parallel to the first direction 12. Optionally, the arm 1540 may be rotated by being coupled to the rotation shaft whose longitudinal direction faces the third direction 16. The rotational shaft may be rotated by the driver. Accordingly, the positions of the free wet nozzle 1510 and the treatment liquid nozzle 1530 installed on the arm 1540 may be changed.

Figure 8:
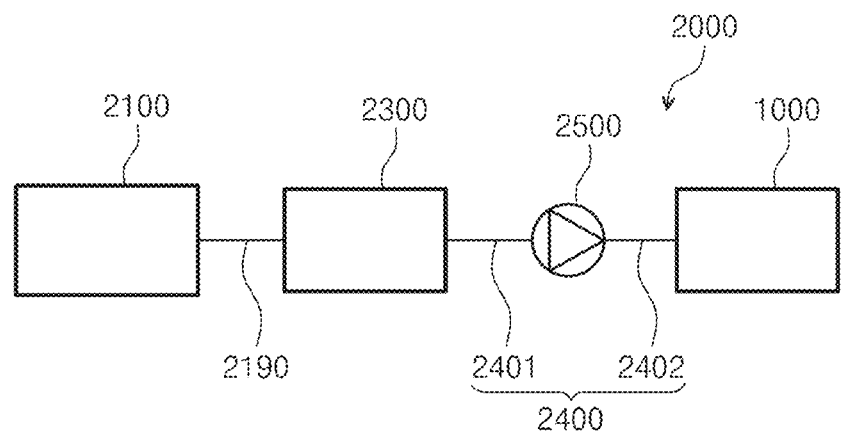
FIG. 8 is a block diagram schematically illustrating a liquid supply apparatus for supplying a treatment liquid to the substrate treating apparatus provided in the liquid treating chamber of FIG. 6.

FIG. 8 is a block diagram schematically illustrating the liquid supply apparatus for supplying the treatment liquid to the substrate treating apparatus provided in the liquid treating chamber of FIG. 6.

Referring to FIG. 8, the substrate treating apparatus 10 according to the exemplary embodiment may further include a liquid supply device 2000. The liquid supply device 2000 may supply a treatment liquid to the liquid treating chamber 360. The liquid supply device 2000 may be provided in the coating block 30a or the developing block 30b of the substrate treating apparatus 10. The liquid supply device 2000 may supply a treatment liquid to the substrate treating apparatus 1000 provided in the liquid treating chamber 360. For example, the liquid supply device 2000 may supply the treatment liquid to the liquid discharge unit 1500. The treatment liquid supplied by the liquid supply device 2000 may be a treatment liquid used in the liquid treating chamber 360. For example, the treatment liquid supplied by the liquid supply device 2000 may be a photoresist.

The liquid supply device 2000 may include a liquid supply unit 2100, a trap unit 2300, and a pump unit 2500.

The treatment liquid contained in the bottle 2200 of the liquid supply unit 2100 to be described later may be transferred to the trap unit 2300 through the chemical liquid line 2190. The treatment liquid transferred to the trap unit 2300 may be transferred to the substrate treating apparatus 1000 provided to the liquid treating chamber 360 through the pump 2500. For example, the treatment liquid transferred to the trap unit 2300 may be transferred to the substrate treating apparatus 1000 through a chemical liquid channel 2400. The chemical liquid channel 2400 may include a first chemical liquid channel 2401 installed upstream the pump 2500 and a second chemical liquid channel 2402 installed downstream the pump 2500.

The liquid supply unit 2100 may supply the treatment liquid to the substrate treating apparatus 1000 provided in the liquid treating chamber 360. The liquid supply unit 2100 may supply the treatment liquid to the trap unit 2300 disposed between the liquid treating chamber 360 and the liquid supply unit 2100.

The trap unit 2300 may remove impurities in the treatment liquid received from the liquid supply unit 2100 or remove bubbles in the treatment liquid. The trap unit 2300 may be a tank in which a component (for example, a filter)

capable of removing impurities in the treatment liquid and/or bubbles in the treatment liquid is installed.

The pump unit 2500 may withdraw the treatment liquid supplied to the trap unit 2300 from the trap unit 2300 and transmit the treatment liquid to the substrate treating apparatus 1000 of the liquid treating chamber 360.

Figure 9:
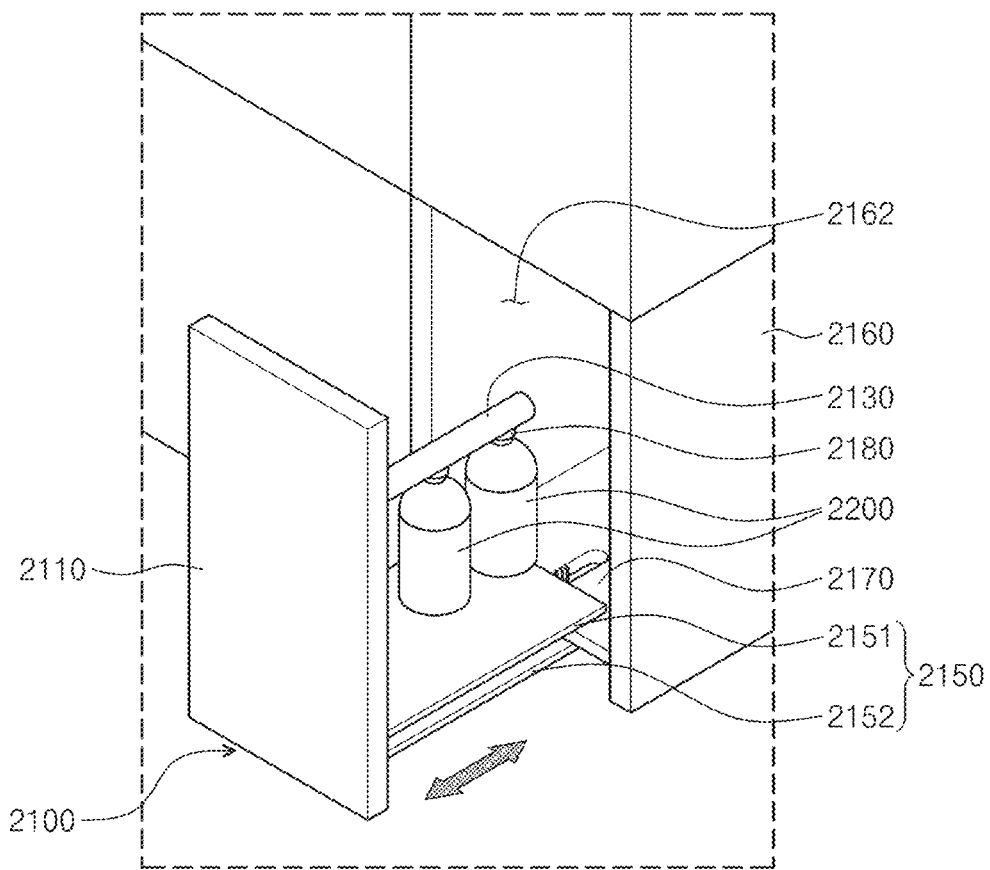
FIG. 9 is a perspective view of the liquid supply unit of FIG. 8 viewed from one direction.
Figure 10:
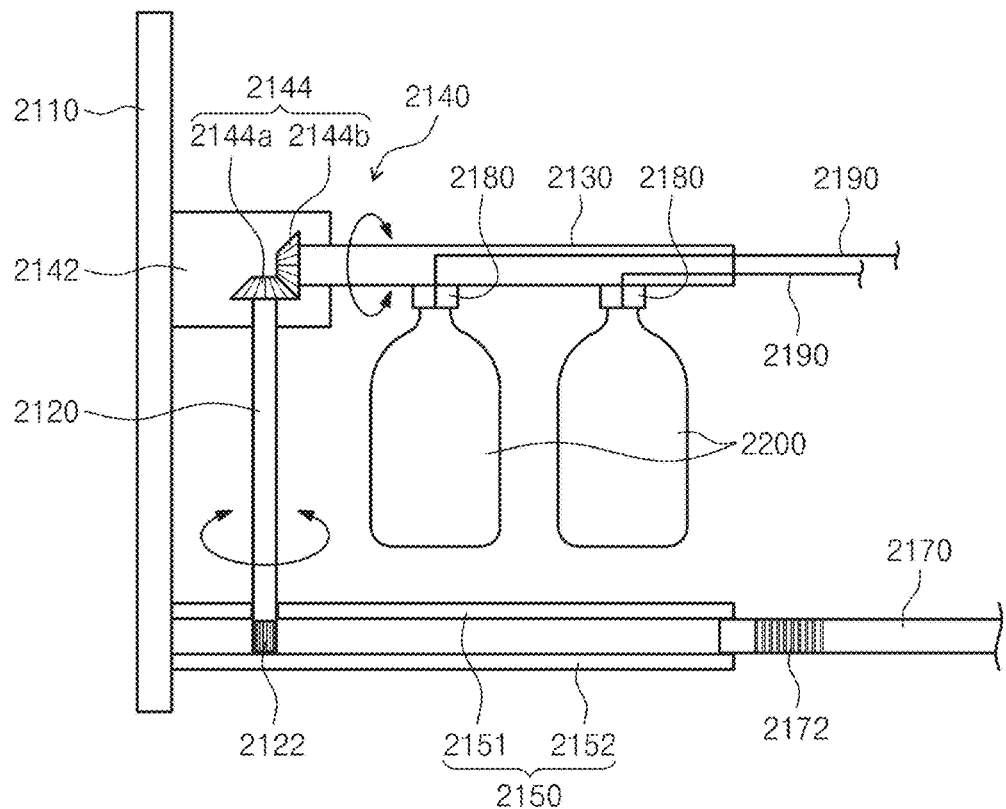
FIG. 10 is a diagram schematically illustrating a part of the liquid supply unit of FIG. 9.
Figure 11:
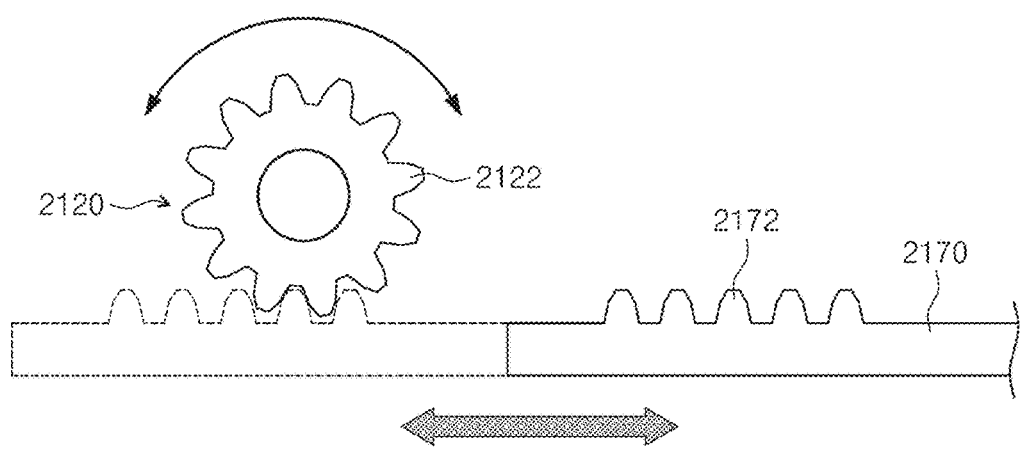
FIG. 11 is a diagram of a first shaft and a rotation generating part of FIG. 10 as viewed from above.
Figure 12:
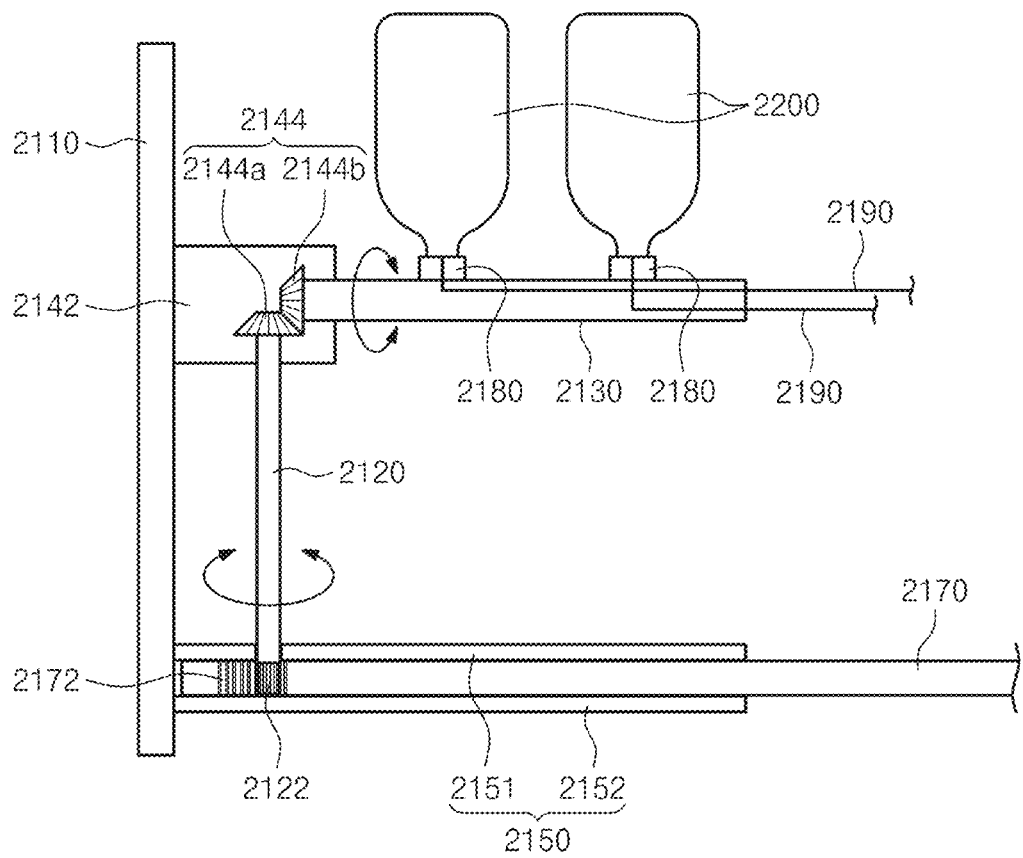
FIG. 12 is a diagram illustrating a state in which a posture of a bottle of FIG. 10 is changed.

FIG. 9 is a perspective view of the liquid supply unit of FIG. 8 viewed from one direction, FIG. 10 is a diagram schematically illustrating a part of the liquid supply unit of FIG. 9, FIG. 11 is a diagram of a first shaft and a rotation generating part of FIG. 10 as viewed from above, and FIG. 12 is a diagram illustrating a state in which a posture of a bottle of FIG. 10 is changed.

Referring to FIGS. 9 to 12, the liquid supply unit 2100 may supply a treatment liquid to the liquid treating chamber 360. The liquid supply unit 2100 may include a cabinet 2110, a first shaft 2120, a second shaft 2130, a cross shaft connection part 2140, a guide part 2150, a frame 2160, and a rotation generating part 2170, a cap 2180, and a chemical liquid line 2190.

The frame 2160 may have an internal space 2162. The frame 2160 may have the internal space 2162 with one side open so that the cabinet 2110 may be inserted thereinto. The cabinet 2110 may be configured to be insertable into the internal space 2162.

The cabinet 2110 may be slid and move linearly between a first position and a second position. A guide unit 2150 may be installed in the cabinet 2110 to guide the linear movement of the cabinet 2110. The guide part 2150 may include a first guide part 2151 and a second guide part 2152. The first guide part 2151 and the second guide part 2152 may be installed to face each other with the rotation generating part 2170, which may be installed on the frame 2160, interposed therebetween. The first guide part 2151 and the second guide part 2152 may guide the direction of linear motion of the cabinet 2110.

In addition, the above-described first position may be a position in which the cabinet 2110 is inserted into the internal space 2162 and the bottle 2200 to be described later is provided in the internal space 2162. When the bottle 2200 is provided in the internal space 2162, the treatment liquid in the bottle 2200 may be supplied to the liquid treating chamber 360, so the first position may be referred to as a supply position. The second position may be a position in which the cabinet 2110 moves out of the internal space 2162 and the bottle 2200 to be described later moves out of the internal space 2162. When the bottle 2200 moves out of the internal space 2162, the bottle 2200 mounted on the cabinet 2100 may be replaced with another bottle 2200, and thus the second position may be referred to as a replacement position.

The first shaft 2120 and the second shaft 2130 may be installed in the cabinet 2110. The first shaft 2120 and the second shaft 2130 may transmit the rotational motion generated by the rotation generating part 2170 to the bottle 2200. The first shaft 2120 may have a longitudinal direction perpendicular to the ground. The rotation axis of the first shaft 2120 may be in a direction perpendicular to the ground. The rotation axis of the second shaft 2130 may intersect with the rotation axis of the first shaft 2120. For example, the longitudinal direction of the second shaft 2130 may be a direction parallel to the ground. The rotation axis of the second shaft 2130 may be in a direction parallel to the ground. A rotation axis of the second shaft 2130 may be perpendicular to a rotation axis of the first shaft 2120.

In addition, the second shaft 2130 may be provided with a cap 2180 to be described later. A chemical solution line 2190 to be described later may be connected to the cap 2180. In addition, the second shaft 2130 may be provided as a hollow shaft to which the chemical liquid line 2190 to be described later may be provided.

Motion transmission between the first shaft 2120 and the second shaft 2130, which cross each other, may be performed by the cross shaft connection part 2140. The cross shaft connection part 2140 may be installed in the cabinet 2110. The cross shaft connection part 2140 may include a gear box 2142 and a bevel gear 2144. A bevel gear 2144 may be provided within the gear box 2142. The bevel gear 2144 may include a driving gear 2144a and a driven gear 2144. The driving gear 2144a may be installed at one end of the first shaft 2120. The driven gear 2144b may be installed at one end of the second shaft 2130. That is, the second shaft 2130 may be rotated depending on the rotation of the first shaft 2120.

Also, a shaft groove 2122 may be formed at the other end of the first shaft 2120 opposite to one end of the first shaft 2120. The shaft groove 2122 may come into contact with the rotation groove 2172 of the rotation generating part 2170 to be described later. For example, the shaft groove 2122 may contact the rotation groove 2172 of the rotation generating part 2170 to rotate the first shaft 2120. The rotational motion of the first shaft 2120 may be transmitted to the second shaft 2130 via the bevel gear 2144. As shown in FIG. 12, when the second shaft 2130 is rotated, the bottle 2200 that is replaceably mounted on the second shaft 2130 may be rotated.

The rotation generating part 2170 may rotate the bottle 2200 so that the direction in which the inlet of the bottle 2200 faces is changed. The rotation generating part 2170 may have a plate shape. The rotation generating part 2170 may be installed in the frame 2160. A rotation groove 2172 capable of contacting the shaft groove 2122 of the above-described first shaft 2120 may be formed on one side of the rotation generating part 2170.

The rotation generating part 2170 may rotate the bottle 2200 by converting a linear motion of the cabinet 2110 (for example, a sliding motion of the cabinet 2110) into a rotational motion. When the cabinet 2110 slides between the first position and the second position to make a linear motion, the rotation groove 2172 and the shaft groove 2122 may contact each other through the linear motion. The rotation groove 2172 of the rotation generating part 2170 may generate rotational motion in the first shaft 2120. Accordingly, the second shaft 2130 may be rotated.

The bottle 2200 may be replaceably mounted on the second shaft 2130. The bottle 2200 may be mounted on the cabinet 2110 via the second shaft 2130. A cap 2180 connected to the chemical liquid line 2190 may be installed on the second shaft 2130. A spiral groove corresponding to the screw groove formed on the outer surface of the inlet of the bottle 2200 may be formed on the inner surface of the cap 2180. Also, a plurality of bottles 2200 may be provided. The cap 2180 and the chemical liquid line 2190 may be provided in a number corresponding to the number of bottles 2200.

When the bottle 2200 is in the second position away from the internal space 2162 of the frame 2160, the inlet of the bottle 2200 may face in the upper direction (see FIG. 10). When the inlet of the bottle 2200 faces in the upper direction, the bottle 2200 may be replaced, so the posture of the bottle 2200 may be defined as a replacement posture.

In addition, when the cabinet 2110 is located in the first position in which the bottle 2200 is provided in the internal space 2162 of the frame 2160, the bottle 2200 may be rotated so that the inlet of the bottle 2200 faces in the lower direction (see FIG. 12). When the inlet of the bottle 2200 faces in the lower direction, the treatment liquid in the bottle 2200 may be supplied to the liquid treating chamber 360, so the posture of the bottle 2200 may be defined as a supply posture. For example, when the bottle 2200 is provided in the first position, the bottle 2200 may be in the supply posture, and when the cabinet 2110 is provided in the second position, the bottle 2200 may be in the replacement posture.

Figure 13:
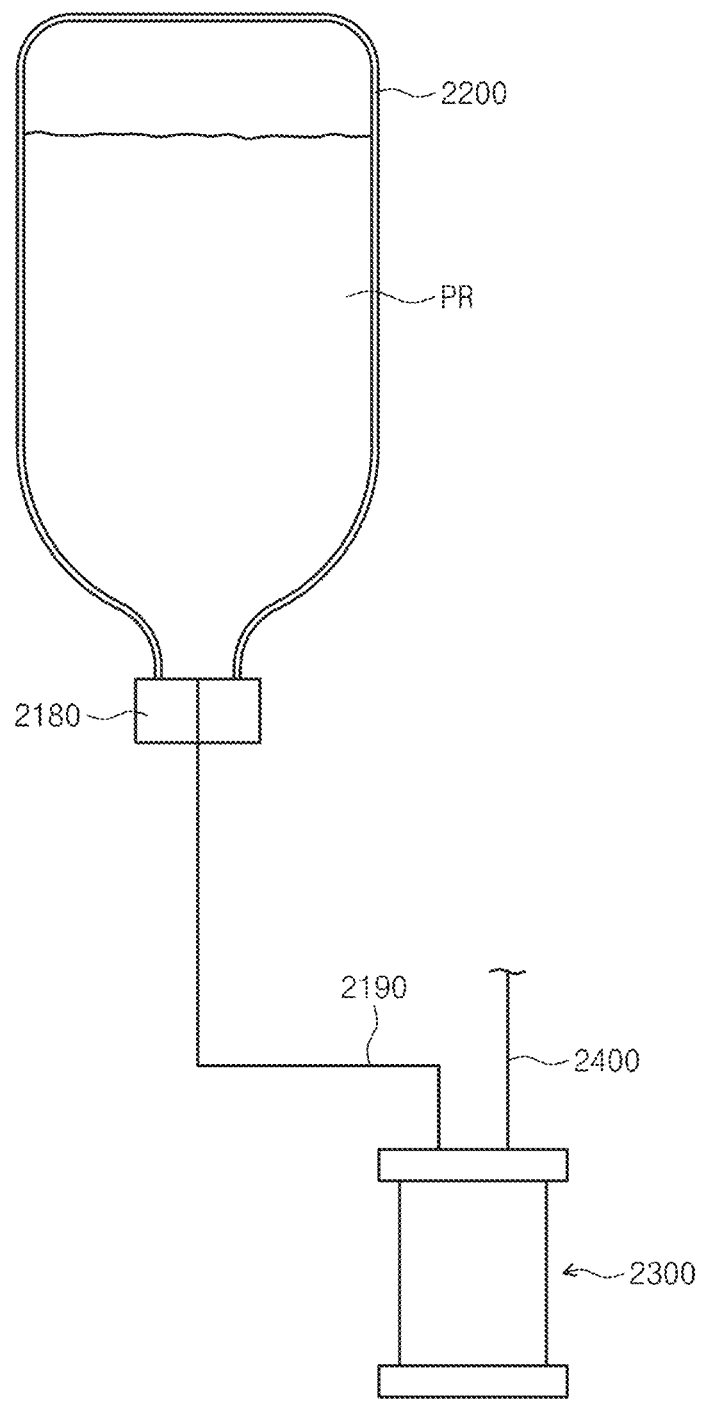
FIG. 13 is a diagram showing a bottle in a supply posture state and a trap unit receiving a treatment liquid from the bottle.
Figure 14:
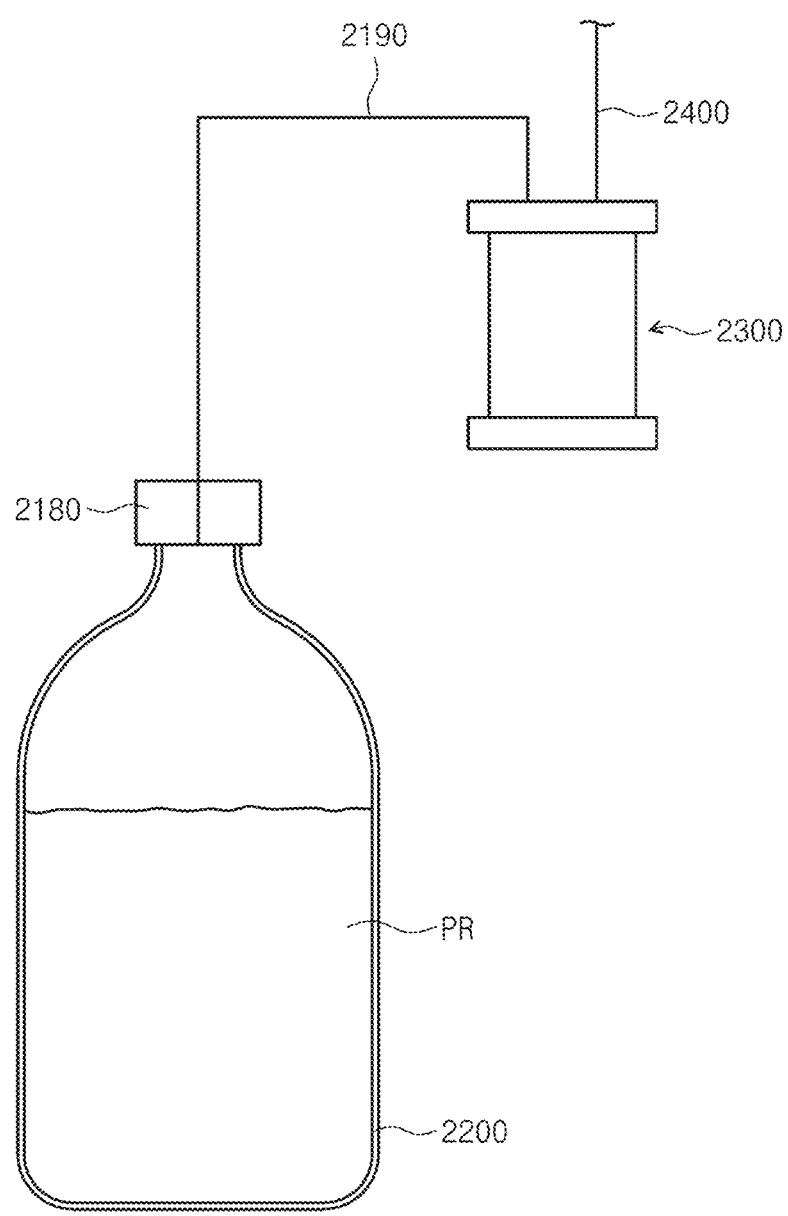
FIG. 14 is a diagram showing a bottle in a replacement exchange posture state and a trap unit receiving a treatment liquid from the bottle.

FIG. 13 is a diagram showing the bottle in the supply posture state and the trap unit receiving the treatment liquid from the bottle, and FIG. 14 is a diagram showing the bottle in the replacement posture state and the trap unit receiving the treatment liquid from the bottle.

Referring to FIGS. 13 and 14, the trap unit 2300 may be disposed at a lower position than the bottle 2200. For example, when the trap unit 2300 is in the supply posture in which the inlet of the bottle 2200 faces in the lower direction, the trap unit 2300 may be disposed at a lower position than the bottle 2200.

When the bottle 2200 is in the supply posture, when the bottle 2200 is positioned at a lower height than the trap unit 2300, an air back flow phenomenon in which the chemical liquid line 2190 (a chemical solution tube) is filled with air may occur. As such, when the chemical liquid line 2190 is filled with air, the filled air may be transferred to the liquid treating chamber 360 together with the treatment liquid. Such air may cause bubbles in the treatment liquid.

However, according to the embodiment of the present invention, when the bottle 2200 is in the supply posture, the bottle 2200 is positioned at a higher height than the trap unit 2300. Accordingly, a section in which the air back flow phenomenon due to a water head difference may occur is deleted. Accordingly, it is possible to minimize the generation of bubbles in the treatment liquid because the chemical liquid line 2190 is filled with air.

Also, when the bottle 2200 is in the replacement posture, the bottle 2200 may be positioned at a lower height than the trap unit 2300. In some cases, an operator needs to visually check whether the treatment liquid contained in the bottle 2200 is being well transferred to the trap unit 2300 through the chemical liquid line 2190, which is a transparent or translucent tube. When the trap unit 2300 is installed at an excessively low height, it may be difficult for an operator to check whether the treatment liquid is well transferred to the trap unit 2300. Accordingly, according to the embodiment of the present invention, the trap unit 2300 does not need to be installed at an excessively low height in order not to cause an air bag flow problem due to the above-described head difference by positioning the bottle 2200 at a lower height than the trap unit 2300 when the bottle 2200 is in the replacement posture, and by positioning the bottle 2200 at a higher height than the trap unit 2300 when the bottle 2200 is in the supply posture.

In addition, the bottle 2200 in the supply posture may have the inlet facing in the lower direction. Accordingly, the photoresist PR, which is a treatment liquid that may be contained in the bottle 2200, may be transferred to the chemical liquid line 2190 by gravity. That is, according to the embodiment of the present invention, in order to transfer the treatment liquid in the bottle 2200 to the liquid treating chamber 360 (more specifically, to transfer the treatment liquid to the trap unit 2300), the inert gas does not need to be not supplied. Accordingly, generation of bubbles or particles in the treatment liquid contained in the bottle 2200 may be minimized, and thus, efficiency of treating the substrate W by using the treatment liquid may be improved.

In the above-described example, the case where a line for supplying the inert gas is not provided, but only the chemical liquid line 2190 is provided has been described as an example, but the present invention is not limited thereto.

Figure 15:
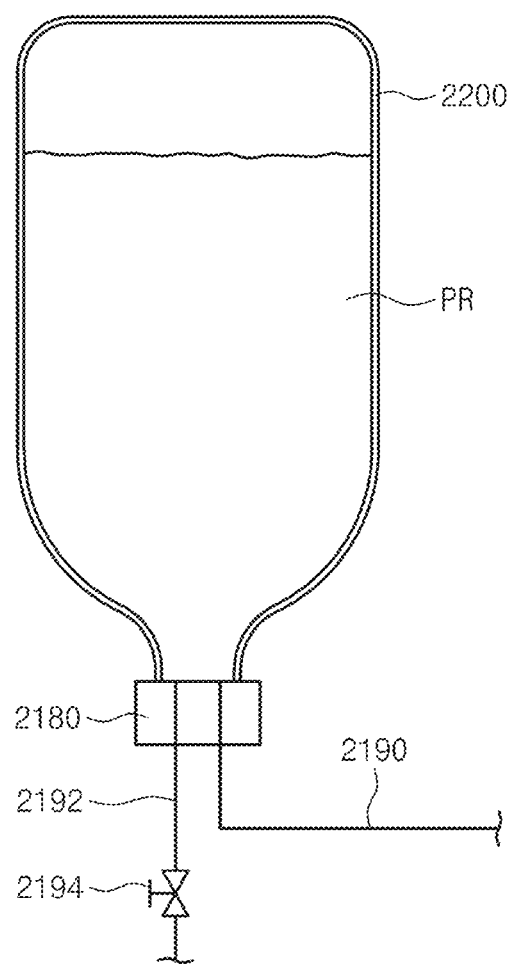
FIG. 15 is a diagram illustrating a state of a liquid supply unit according to another embodiment of the present invention.

For example, as shown in FIG. 15, a gas line 2192 may be connected to the cap 2180. The gas line 2192 may supply inert gas into the bottle 2200. The gas line 2192 may supply inert gas pressurizing the space within the bottle 2200. The inert gas may be nitrogen gas. In addition, a gas valve 2194 may be installed in the gas line 2192. The user may set whether to open or close the belt 2194 through the controller.

For example, a user may close the valve 2194 by setting through a controller. While the treatment liquid in the bottle 2200 is transferred to the liquid treating chamber 360 (that is, while the processing process for the substrate W is being performed), the user may close the valve 2194 by setting through the controller.

Figure 16:
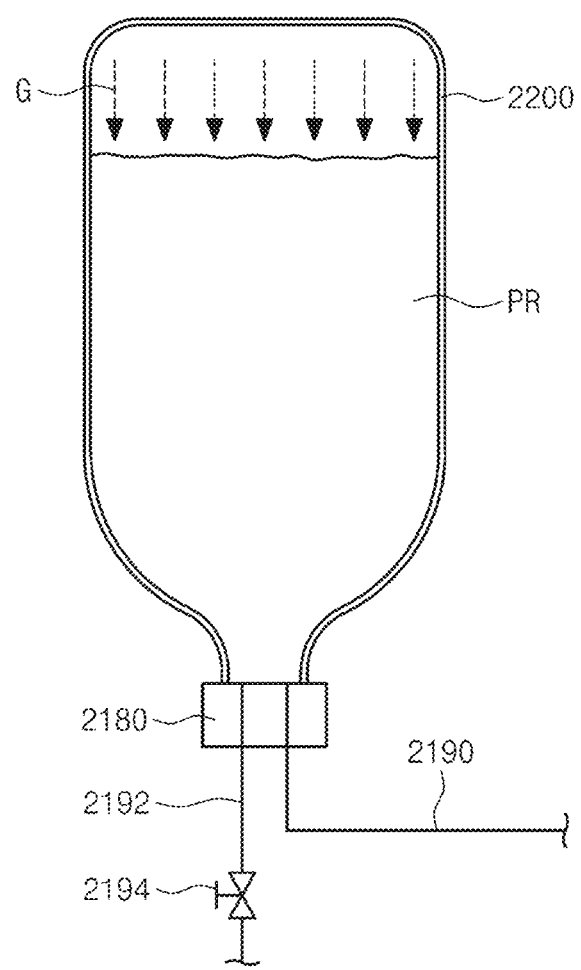
FIG. 16 is a diagram illustrating a state in which the treatment liquid in the bottle of FIG. 15 is delivered to a chemical liquid line.

A user may need to supply inert gas into the bottle 2200 as needed. For example, in order to completely withdraw the treatment liquid contained in the bottle 2200, it may be necessary to supply an inert gas pressurizing the space within the bottle 2200 as shown in FIG. 16. In this case, the user may adjust the opening and an opening rate of the belt 2194 by setting through the controller. That is, the controller may control the opening and closing of the gas valve 2194 so that the gas line 2192 selectively supplies the inert gas to the space within the bottle 2200 according to the user's setting.

Figure 17:
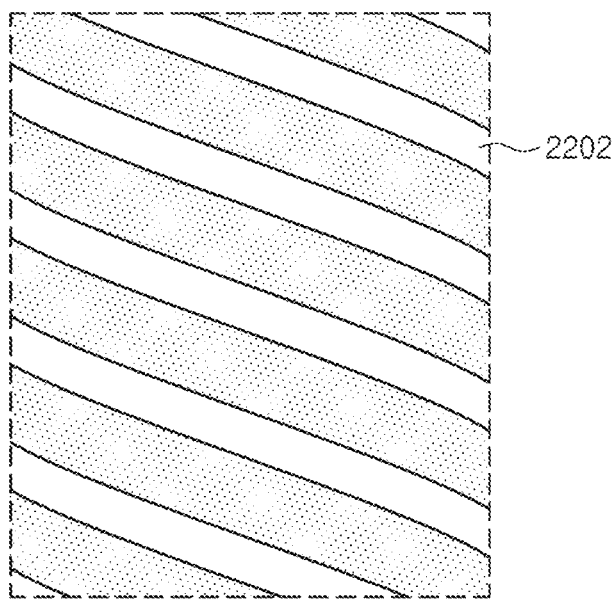
FIGS. 17 and 18 are diagrams illustrating a shape of a groove that may be formed in a bottle.
Figure 18:
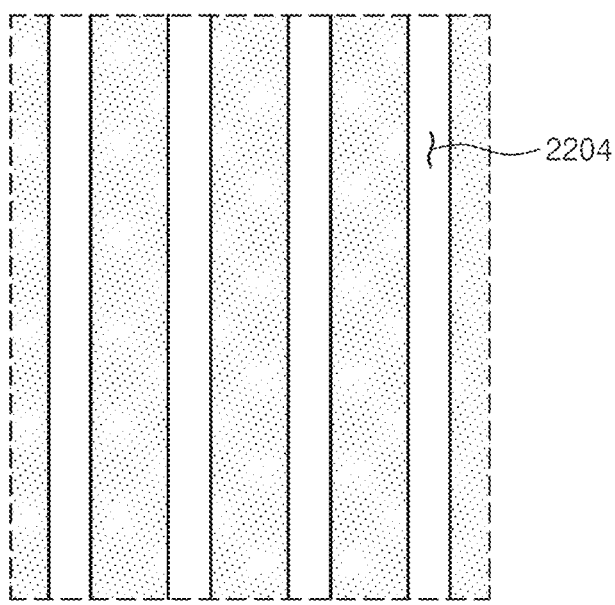

FIGS. 17 and 18 are diagrams illustrating a shape of a groove that may be formed in the bottle. As described above, the bottle 2200 may be rotated to switch the posture between the supply posture and the replacement posture. When the bottle 2200 is switched from the replacement posture to the supply posture, the treatment liquid at the bottom of the bottle 2200 may flow toward the inlet of the bottle 2200. An oblique groove 2202 or a vertical groove 2204 may be formed in the bottle 2200 to further facilitate the flow of the treatment liquid.

Figure 19:
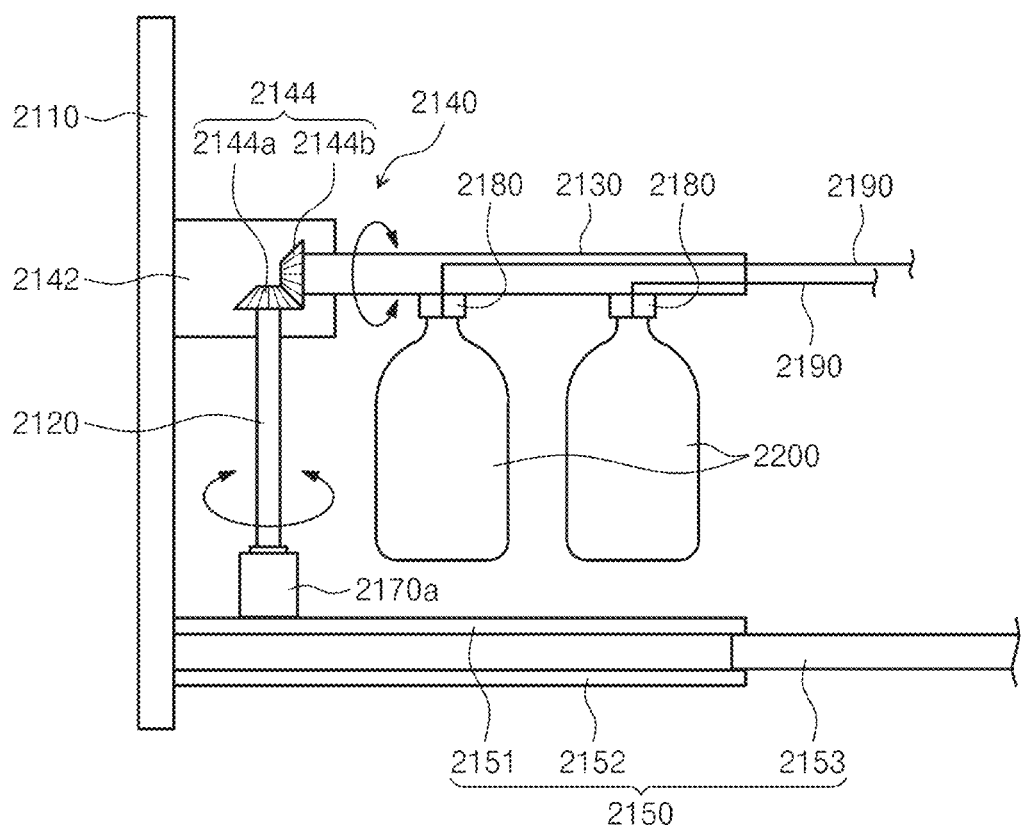
FIG. 19 is a diagram showing a state of a liquid supply unit according to another embodiment of the present invention.

In the above-described example, the case were the rotation generating part 2170 converts the linear motion of the cabinet 2110 into the rotational motion to rotate the bottle 2200 has been described as an example, but the present invention is not limited thereto. For example, as shown in FIG. 19, the rotation generating part 2170a may be configured to rotate the bottle 2200 irrespective of the linear motion of the cabinet 2110. For example, the rotation generating part 2170a may be provided as a driving device, such as a motor, capable of generating driving force. The rotation generating part 2170a may be mechanically coupled to the first shaft 2120. The driving force generated by the rotation generating part 2170a is transmitted to the bottle 2200 via the first shaft 2120 and the second shaft 2130, and the bottle 2200 may be rotated. Also, the rotation generating part 2170a may be operated by a switch that may be operated by a user and transmits a control signal to the rotation generating part 2170a. Alternatively, a position sensor may be installed in the cabinet 2110 or the frame 2160. The position sensor may identify whether the position of the cabinet 2110 is the supply position or the replacement position. The rotation generating part 2170a may rotate the bottle 2200 based on the position identified by the position sensor.

Figure 20:
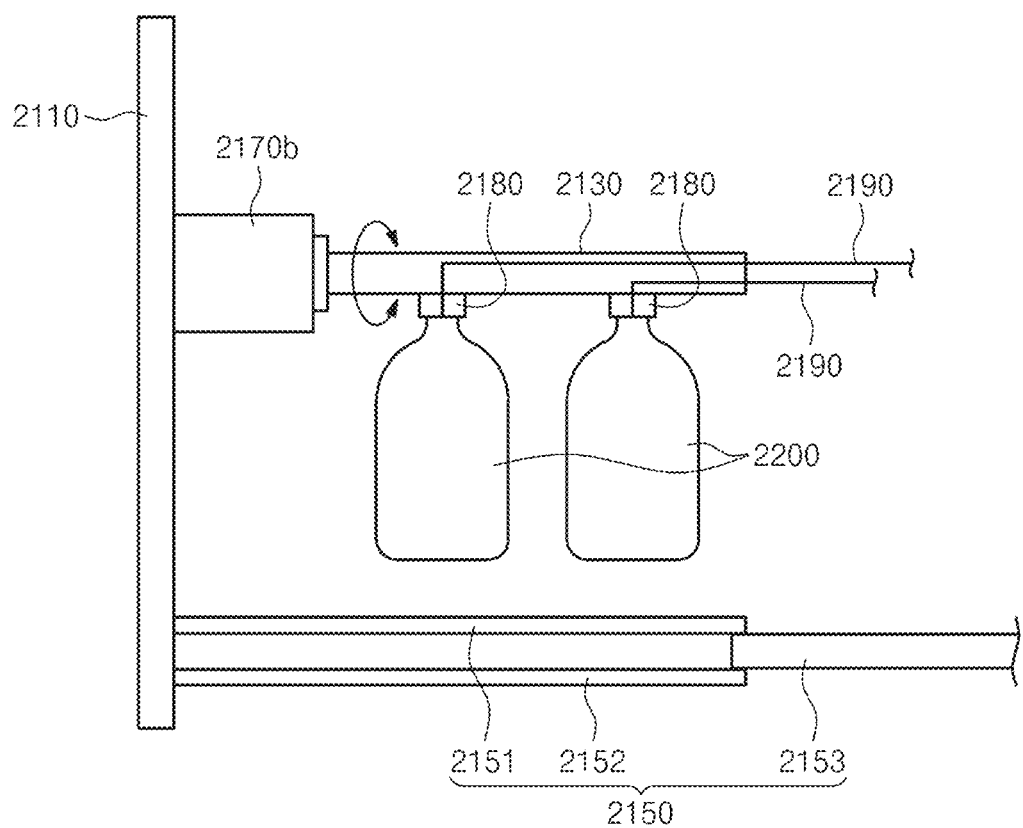
FIG. 20 is a diagram showing a state of a liquid supply unit according to another embodiment of the present invention.

In the above-described example, the case where the driving force generated by the rotation generating part 2170a is transmitted to the bottle 2200 via the first shaft 2120 and the second shaft 2130 has been described as an example, but the present invention is not limited thereto. For example, as shown in FIG. 20, the rotation generating part 2170b may be mechanically coupled to the second shaft 2130. The driving force generated by the rotation generating part 2170b is transmitted to the bottle 2200 via the second shaft 2130, and the bottle 2200 may be rotated. Also, the rotation generating part 2170b may be operated by a switch which is operable by a user and transmits a control signal to the rotation generating part 2170b. Alternatively, a position sensor may be installed in the cabinet 2110 or the frame 2160. The position sensor may identify whether the position of the cabinet 2110 is the supply position or the replacement position. The rotation generating part 2170b may rotate the bottle 2200 based on the position identified by the position sensor.

Figure 21:
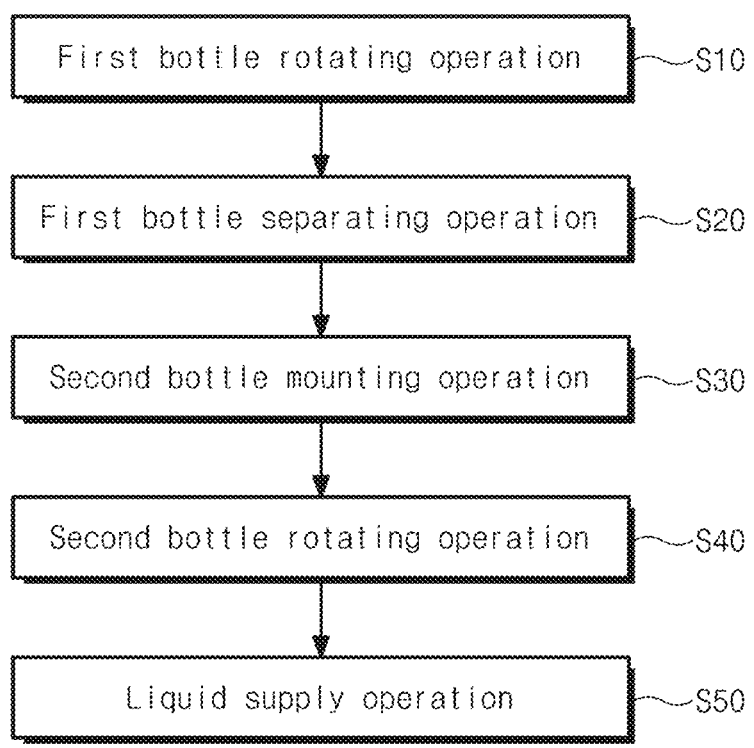
FIG. 21 is a flowchart for describing a bottle replacement method according to an embodiment of the present invention.

Hereinafter, a bottle replacement method according to an embodiment of the present invention will be described in detail. FIG. 21 is a flowchart for describing a bottle replacement method according to an embodiment of the present invention. Referring to FIG. 21, a method of replacing the bottle 2200 supplying the treatment liquid to the substrate treating apparatus 1000 of the liquid treating chamber 360 liquid-treating the substrate W may include a first bottle rotating operation S10, a first bottle separating operation S20, a second bottle mounting operation S30, a second bottle rotating operation S40, and a liquid supply operation S50.

A first bottle described below may be a used bottle 2200 that has supplied a predetermined amount of treatment liquid to the liquid treating chamber 360. Also, a second bottle may be an unused bottle 2200 containing the treatment liquid supplied to the liquid treating chamber 360. The first bottle and the second bottle may be different bottles. In addition, the first bottle and the second bottle may be different from each other, but structurally have the same shape. For example, the first bottle and the second bottle may have the same shape as the bottle 2200. In addition, the first bottle and the second bottle may be made of a material including glass.

The first bottle rotating operation S10 may be an operation of rotating the first bottle mounted on the cabinet 2110 by sliding the cabinet 2110 to the replacement position. For example, when the user pulls the cabinet 2110 and slides the cabinet 2110 to the replacement position, the first bottle mounted on the cabinet 2110 may be rotated. When the first bottle rotating operation S10 is completed, the direction in which an inlet of the first bottle faces may be changed from a downward direction to an upward direction. That is, in the first bottle rotating operation S10, the posture of the first bottle may be changed from the supply posture to the replacement posture.

The first bottle separating operation S20 may be an operation in which the user separates the first bottle from the cabinet 2110. For example, in the first bottle separating operation S20, the first bottle may be separated from the cap 2180 installed on the second shaft 2130. In the first bottle separating operation S20, the user may separate the used first bottle from the cap 2180 of the second shaft 2130 connected to the cabinet 2110. In the first bottle separating operation S20, the first bottle may have the replacement posture in which the inlet of the first bottle faces in the upper direction.

The second bottle mounting operation S30 may be performed while the cabinet 2110 is positioned at the replacement position. The second bottle mounting operation S30 may be an operation in which the user mounts the second bottle, which is an unused bottle, to the cabinet 2110 at the replacement position. In the second bottle mounting operation S30, an inlet of the second bottle may face in the upper direction. That is, in the second bottle mounting operation S30, the posture of the bottle may be the replacement posture.

In the second bottle rotating operation S40, the posture of the second bottle may be changed from the replacement posture to the supply posture. The second bottle rotating operation S40 may be performed by pushing, by an operator, the cabinet 2110 into the internal space 2162 of the frame 2160. For example, when the user pushes the cabinet 2110 into the internal space 2162, the second bottle is positioned at the supply position. When the second bottle moves from the replacement position to the supply position, the second bottle may be rotated to change from the replacement position to the supply position. That is, the second bottle may be rotated by the rotation generating parts 2170, 2170a, and 2170b, and the direction in which the inlet faces may be changed from the upper direction to the lower direction. Also, the second bottle may be rotated by converting a linear motion of the cabinet 2110 into a rotation motion rotating the second bottle.

The liquid supply operation S50 may be an operation in which the treatment liquid in the bottle is transferred to the substrate treating apparatus 1000 of the liquid treating chamber 360 through the chemical liquid line 2190. In the liquid supply operation S50, the treatment liquid in the second bottle may be supplied to the liquid treating chamber 360 with the inlet of the second bottle facing in the lower direction.

The foregoing detailed description illustrates the present invention. In addition, the above description illustrates and describes the exemplary embodiments of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. An apparatus for treating a substrate, the apparatus comprising:
   a liquid treating chamber configured to liquid-treat the substrate by supplying a treatment liquid to the substrate; and
   a liquid supply unit configured to supply the treatment liquid to the liquid treating chamber, wherein the liquid supply unit includes:
     a cabinet configured to be mounted with a bottle containing the treatment liquid; and
     a rotation generating part configured to rotate the bottle so that a direction in which an inlet of the bottle mounted on the cabinet faces is changed, wherein the rotation generating part is configured to generate a rotational motion to rotate the bottle using a linear motion of the cabinet moving between a first position and a second position.

2. The apparatus of claim 1, wherein the liquid supply unit further includes a frame having an internal space,
   the cabinet is configured to be insertable into the internal space, and
   the rotation generating part is configured to rotate the bottle so that the inlet of the bottle faces in a lower direction when the bottle mounted on the cabinet is located in the first position provided in the internal space.

3. The apparatus of claim 2, wherein the rotation generating part is configured to rotate the bottle so that the inlet of the bottle faces in an upper direction when the bottle mounted on the cabinet is located in the second position that is out of the internal space.

4. The apparatus of claim 1, wherein the liquid supply unit includes:
a first shaft configured to receive rotational force generated by the rotation generating part; and
a second shaft to which the bottle is mounted and which is configured to rotate while being dependent on the rotation of the first shaft, and
the first shaft and the second shaft are installed in the cabinet.

5. The apparatus of claim 4, wherein a rotation axis of the first shaft and a rotation axis of the second shaft intersect with each other, and
the liquid supply unit includes a cross shaft connection part that is configured to transmit motion between the first shaft and the second shaft which are cross shafts.

6. The apparatus of claim 5, wherein the cross shaft connection part includes:
a driving gear installed at one end of the first shaft; and
a driven gear installed at one end of the second shaft.

7. The apparatus of claim 6, wherein the liquid supply unit includes:
a cap which is installed on the second shaft and on which the bottle is mounted; and
a chemical liquid line which is connected to the cap and is configured to move the treatment liquid in the bottle mounted on the cap to the liquid treating chamber.

8. The apparatus of claim 7, wherein the liquid supply unit further includes:
a gas line connected to the cap and configured to supply gas pressurizing a space in the bottle; and
a gas valve installed in the gas line.

9. The apparatus of claim 8, further comprising:
a controller,
wherein the controller is configured to control opening and closing of the gas valve so that the gas line selectively supplies gas to the space within the bottle according to a user's setting.

10. The apparatus of claim 7, further comprising:
a trap unit configured to remove impurities in the treatment liquid discharged through the chemical liquid line from the bottle mounted on the cabinet and delivered to the liquid treating chamber or air bubbles or impurities in the treatment liquid.

11. The apparatus of claim 10, wherein the trap unit is positioned below the bottle when the inlet of the bottle mounted on the cabinet faces in a lower direction.

12. A liquid supply unit for supplying a treatment liquid to a liquid treating chamber, the liquid supply unit comprising:
a cabinet to which a bottle is replaceably mounted; and
a rotation generating part configured to rotate the bottle so that a posture of the bottle is changed from a supply posture in which an inlet of the bottle faces in a lower direction and the treatment liquid in the bottle is supplied to the liquid treating chamber to a replacement posture in which the inlet of the bottle faces in an upper direction, wherein the rotation generating part is configured to generate a rotational motion to change the posture of the bottle using a linear motion of the cabinet in which the cabinet moves between a first position and a second position.

13. The liquid supply unit of claim 12, wherein the cabinet is configured to move between the first position and the second position different from the first position, and
the rotation generating part is configured to rotate the bottle according to the first position and the second position of the cabinet.

14. The liquid supply unit of claim 13, wherein the liquid supply unit further includes a frame having an internal space,
the first position is a position where the bottle is provided in the internal space, and the second position is a position where the bottle is out of the internal space, and
the rotation generating part is configured such that the bottle is in the supply posture when the cabinet is located in the first position, and the bottle is in the replacement posture when the cabinet is located in the second position.

15. An apparatus for treating a substrate, the apparatus comprising:
a liquid treating chamber configured to liquid-treat the substrate by supplying a treatment liquid to the substrate; and
a liquid supply unit configured to supply the treatment liquid to the liquid treating chamber, wherein the liquid supply unit includes:
a cabinet configured to be mounted with a bottle containing the treatment liquid;
a rotation generating part configured to rotate the bottle so that a direction in which an inlet of the bottle mounted on the cabinet faces is changed;
a first shaft configured to receive rotational force generated by the rotation generating part;
a second shaft to which the bottle is mounted and which is configured to rotate while being dependent on the rotation of the first shaft, wherein
the first shaft and the second shaft are installed in the cabinet, and
a rotation axis of the first shaft and a rotation axis of the second shaft intersect with each other;
a cross shaft connection part configured to transmit motion between the first shaft and the second shaft which are cross shafts, wherein
the cross shaft connection part includes a driving gear at one end of the first shaft and a driven gear at one end of the second shaft;
a cap which is installed on the second shaft and on which the bottle is mounted; and
a chemical liquid line which is connected to the cap and is configured to move the treatment liquid in the bottle mounted on the cap to the liquid treating chamber.

* * * * *